(12) United States Patent
Horikiri et al.

(10) Patent No.: US 11,339,500 B2
(45) Date of Patent: May 24, 2022

(54) NITRIDE CRYSTAL SUBSTRATE, SEMICONDUCTOR LAMINATE, METHOD OF MANUFACTURING SEMICONDUCTOR LAMINATE AND METHOD OF MANUFACTURING SEMICONDUCTOR DEVICE

(71) Applicants: SCIOCS COMPANY LIMITED, Hitachi (JP); SUMITOMO CHEMICAL COMPANY, LIMITED, Tokyo (JP)

(72) Inventors: Fumimasa Horikiri, Hitachi (JP); Takehiro Yoshida, Hitachi (JP)

(73) Assignees: SCIOCS COMPANY LIMITED, Hitachi (JP); SUMITOMO CHEMICAL COMPANY, LIMITED, Tokyo (JP)

( * ) Notice: Subject to any disclaimer, the term of this patent is extended or adjusted under 35 U.S.C. 154(b) by 172 days.

(21) Appl. No.: 16/617,802

(22) PCT Filed: Apr. 19, 2018

(86) PCT No.: PCT/JP2018/016128
§ 371 (c)(1),
(2) Date: Mar. 3, 2020

(87) PCT Pub. No.: WO2018/221055
PCT Pub. Date: Dec. 6, 2018

(65) Prior Publication Data
US 2020/0208297 A1    Jul. 2, 2020

(30) Foreign Application Priority Data
May 29, 2017 (JP) .............................. JP2017-105758

(51) Int. Cl.
    *C30B 29/38* (2006.01)
    *C30B 25/20* (2006.01)
    (Continued)

(52) U.S. Cl.
    CPC .............. *C30B 25/20* (2013.01); *C30B 29/38* (2013.01); *H01L 21/205* (2013.01);
    (Continued)

(58) Field of Classification Search
    CPC ....... C30B 25/20; C30B 29/38; H01L 21/205; H01L 21/2015; H01L 33/32
    See application file for complete search history.

(56) References Cited

U.S. PATENT DOCUMENTS

2002/0011599 A1    1/2002    Motoki et al.
2007/0020872 A1    1/2007    Shindo et al.
(Continued)

FOREIGN PATENT DOCUMENTS

CN    1237795 A    12/1999
CN    1961432 A    5/2007
(Continued)

OTHER PUBLICATIONS

A. Y. Polyakov et al.—"Hydride vapor phase GaN films with reduced density of residual electrons and deep traps"; May 13, 2014 (May 13, 2014); Journal of Applied Physics 115; p. 183706-1-183706-2.
(Continued)

*Primary Examiner* — Robert M Kunemund
(74) *Attorney, Agent, or Firm* — Foley & Lardner LLP

(57) ABSTRACT

There is provided a nitride crystal substrate comprising group-III nitride crystal and containing n-type impurities, wherein an absorption coefficient α is approximately expressed by equation (1) in a wavelength range of at least 1 μm or more and 3.3 μm or less: α=n Kλ$^a$ (1) (wherein, (Continued)

$\lambda(\mu m)$ is a wavelength, $\alpha(cm^{-1})$ is absorption coefficient of the nitride crystal substrate at 27° C., n ($cm^{-3}$) is a free electron concentration in the nitride crystal substrate, and K and a are constants, satisfying $1.5 \times 10^{-19} \leq K \leq 6.0 \times 10^{-19}$, a=3).

21 Claims, 14 Drawing Sheets

(51) Int. Cl.
    *H01L 21/20*     (2006.01)
    *H01L 21/205*     (2006.01)
    *H01L 33/00*     (2010.01)
    *H01L 33/32*     (2010.01)

(52) U.S. Cl.
    CPC ........ *H01L 21/2015* (2013.01); *H01L 33/007* (2013.01); *H01L 33/32* (2013.01)

(56) References Cited

U.S. PATENT DOCUMENTS

| | | | |
|---|---|---|---|
| 2007/0023770 A1* | 2/2007 | Miyajima | H01L 31/02165 257/88 |
| 2007/0128753 A1 | 6/2007 | Oshima | |
| 2007/0217460 A1 | 9/2007 | Ishibashi et al. | |
| 2007/0296061 A1* | 12/2007 | Sasaki | C30B 29/403 257/615 |
| 2009/0127664 A1 | 5/2009 | Okahisa et al. | |
| 2011/0108852 A1 | 5/2011 | Fujiwara et al. | |
| 2013/0285066 A1 | 10/2013 | Sumitomo et al. | |
| 2019/0189438 A1 | 6/2019 | Mikawa et al. | |

FOREIGN PATENT DOCUMENTS

| | | |
|---|---|---|
| CN | 1979766 A | 6/2007 |
| CN | 102064471 A | 5/2011 |
| CN | 103377915 A | 10/2013 |
| CN | 109563642 A | 4/2019 |
| JP | 2009-126723 A | 6/2009 |
| JP | 2010-111576 A | 5/2010 |
| JP | 2011-230955 A | 11/2011 |
| JP | 2014-073918 A | 4/2014 |
| JP | 2015-185576 A | 10/2015 |

OTHER PUBLICATIONS

A.S. Barker, Jr et al.—"Infrared Lattice Vibrations and Free-Electron Dispersion in GaN"; Jan. 15, 1973 (Jan. 15, 1973); vol. 6, No. 2; Physical Review B; pp. 743-750.

G. Bentoumi et al.—"Influence of Si doping level on the Raman and IR reflectivity spectra and optical absorption spectrum of GaN"; 1997; Materials Science & Engineering B50; pp. 142-147.

P. Perlin et al.—"Towards the Identification of the Dominant Donor in GaN"; Jul. 10, 1995 (Jul. 10, 1995); vol. 75, No. 2; Physical Review Letters; pp. 296-299.

Sylwester Porowski—"Bulk and homoepitaxial GaN-growth and characterisation"; 1998; Journal of Crystal Growth 189/190; pp. 153-158.

Office Action dated Dec. 4, 2020 for corresponding Chinese Patent Application No. 201880035191.1.

International Searching Authority, "International Search Report," issued in connection with International Patent Application No. PCT/JP2018/016128, dated Jun. 26, 2018.

International Searching Authority, "Written Opinion," issued in connection with International Patent Application No. PCT/JP2018/016128, dated Jun. 26, 2018.

International Preliminary Report on Patentability dated Dec. 3, 2019 for corresponding Application No. PCT/JP2018/016128.

* cited by examiner

NITRIDE CRYSTAL SUBSTRATE, SEMICONDUCTOR LAMINATE, METHOD OF MANUFACTURING SEMICONDUCTOR LAMINATE AND METHOD OF MANUFACTURING SEMICONDUCTOR DEVICE

CROSS-REFERENCE TO RELATED APPLICATIONS

The present application claims priority under 37 U.S.C. § 371 to International Patent Application No. PCT/JP2018/016128, filed Apr. 19, 2018, which claims priority to and the benefit of Japanese Patent Application No. 2017-105758, filed on May 29, 2017. The contents of these applications are hereby incorporated by reference in their entireties.

TECHNICAL FIELD

The present invention relates to a nitride crystal substrate, a semiconductor laminate, a method for manufacturing a semiconductor laminate, and a method for manufacturing a semiconductor device.

DESCRIPTION OF RELATED ART

Group-III nitride semiconductor (hereinafter sometimes referred to as nitride) is widely used as a material for constituting a semiconductor device such as a light emitting device and an electronic device. When manufacturing these semiconductor devices, a step of heating a nitride crystal substrate is sometimes performed, such as a step of epitaxially growing a semiconductor layer on the nitride crystal substrate including group-III nitride semiconductor, a step of activating impurities in the semiconductor layer, and the like (for example, see patent document 1).

Patent document 1: Japanese Patent Laid-Open Publication No. 2015-185576

In the above heating of the nitride crystal substrate, it is required to heat the nitride crystal substrate with high accuracy and good reproducibility.

An object of the present invention is to provide a technique capable of heating the nitride crystal substrate with high accuracy and good reproducibility.

According to an aspect of the present invention, there is provided a nitride crystal substrate and a related technique, the nitride crystal substrate comprising group-III nitride crystal and containing n-type impurities, wherein an absorption coefficient α is approximately expressed by equation (1) in a wavelength range of at least 1 μm or more and 3.3 μm or less:

$$\alpha = nK\lambda^a \quad (1)$$

(wherein, $\lambda(\mu m)$ is a wavelength, $\alpha(cm^{-1})$ is absorption coefficient of the nitride crystal substrate at 27° C., n ($cm^{-3}$) is a free electron concentration in the nitride crystal substrate, and K and a are constants, satisfying $1.5 \times 10^{-19} \leq K \leq 6.0 \times 10^{-19}$, a=3).

Advantage of the Invention

According to the present invention, the nitride crystal substrate can be heated with high accuracy and good reproducibility.

DETAILED DESCRIPTION OF THE INVENTION

First Embodiment of the Present Invention

Figure 1A:
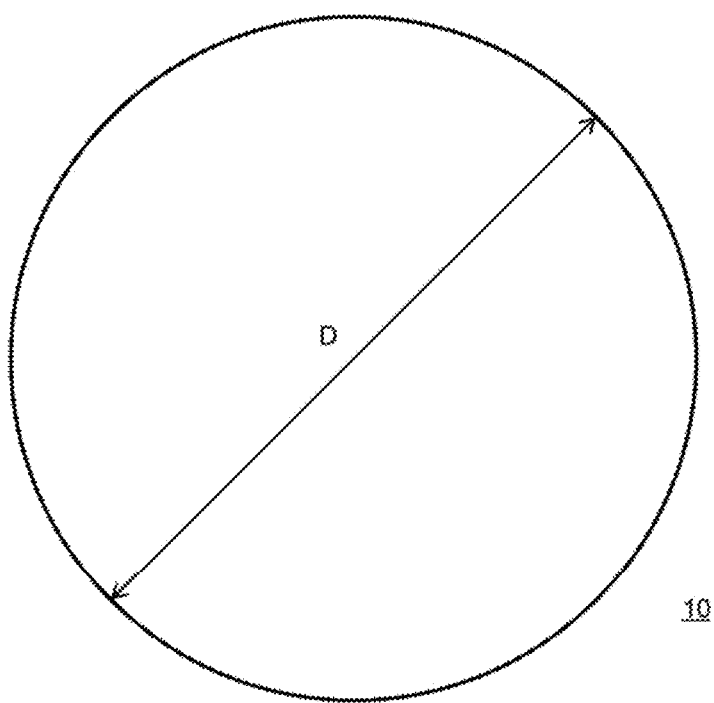
FIG. 1A is a schematic plan view showing a nitride crystal substrate 10 according to a first embodiment of the present invention.

A first embodiment of the present invention will be described hereafter, with reference to the drawings.
(1) Nitride Crystal Substrate With reference to FIGS. 1A and 1B, a nitride crystal substrate 10 according to the present embodiment will be described. FIG. 1A is a schematic plan view showing a nitride crystal substrate 10 according to the present embodiment, and FIG. 1B is a schematic cross-sectional view showing the nitride crystal substrate 10 according to the present embodiment.

In the following, a main surface of a substrate or the like may be referred to as mainly an upper main surface of the substrate or the like, and may also be referred to as a surface of the substrate or the like. A back surface of the substrate or the like may be referred to as mainly a lower main surface of the substrate or the like.

Figure 1B:
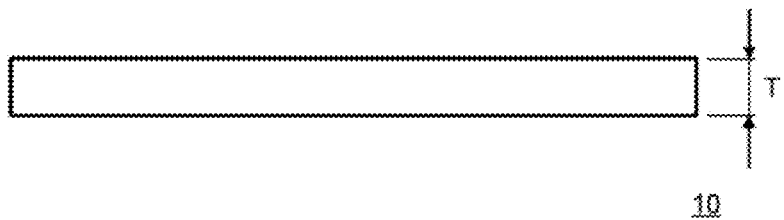
FIG. 1B is a schematic cross-sectional view showing the nitride crystal substrate 10 according to the first embodiment of the present invention.

As shown in FIGS. 1A and 1B, the nitride crystal substrate 10 of the present embodiment (hereinafter also referred to as a substrate 10) is configured as a disk-like substrate used when manufacturing a semiconductor laminate 1 or a semiconductor device 2 described later, or the like. The substrate 10 includes (comprises) a single crystal of group-III nitride semiconductor, and in the present embodiment, includes, for example, a single crystal of gallium nitride (GaN).

A plane orientation of the main surface of the substrate 10 is, for example, a (0001) plane (+c plane, Ga polar plane). The GaN crystal constituting the substrate 10 may have a predetermined off-angle with respect to the main surface of the substrate 10. The off-angle refers to the angle between a normal direction of the main surface of the substrate 10 and a main axis (c-axis) of the GaN crystal constituting the substrate 10. Specifically, the off-angle of the substrate 10 is, for example, 0° or more and 1.2° or less.

Further, a dislocation density on the main surface of the substrate 10 is, for example, $5 \times 10^6/cm^2$ or less. If the dislocation density on the main surface of the substrate 10 is more than $5 \times 10^6/cm^2$, a local breakdown voltage may be reduced in the semiconductor layer 20 formed on the substrate 10 described later. In contrast, according to the present embodiment, since the dislocation density on the main surface of the substrate 10 is $5 \times 10^6/cm^2$ or less, reduction of the local breakdown voltage can be suppressed in the semiconductor layer 20 formed on the substrate 10.

The main surface of the substrate 10 is an epi-ready surface, and a surface roughness (arithmetic mean roughness Ra) of the main surface of the substrate 10 is, for example, 10 nm or less, preferably 5 nm or less.

Further, although a diameter D of the substrate 10 is not particularly limited, the diameter D is 25 mm or more, for example. When the diameter D of the substrate 10 is less than 25 mm, productivity of a semiconductor device 2 described later is likely to be reduced. Therefore, the diameter D of the substrate 10 is preferably 25 mm or more. Further, a thickness T of the substrate 10 is, for example, 150 μm or more and 2 mm or less. If the thickness T of the substrate 10 is less than 150 μm, a mechanical strength of the substrate 10 may be reduced, which may make it difficult to maintain a freestanding state. Therefore, the thickness T of the substrate 10 is preferably 150 μm or more. Here, for example, the diameter D of the substrate 10 is 2 inches, and the thickness T of the substrate 10 is 400 μm.

Further, the substrate 10 contains, for example, n-type impurities (donor). Examples of the n-type impurities contained in the substrate 10 include silicon (Si) and germanium (Ge). Since the substrate 10 is doped with the n-type impurities, free electrons having a predetermined concentration are generated in the substrate 10.

(Regarding Absorption Coefficient Etc.)

In the present embodiment, the substrate 10 satisfies predetermined requirements for the absorption coefficient in an infrared region. Details will be described hereafter.

When manufacturing a semiconductor laminate 1 or a semiconductor device 2, for example, a step of heating the substrate 10 is performed, such as a step of epitaxially growing a semiconductor layer 20 on the substrate 10, a step of activating impurities in the semiconductor layer 20, and the like, as described later. For example, when the substrate 10 is heated by irradiating the substrate 10 with infrared rays (infrared light), it is important to set a heating condition based on the absorption coefficient of the substrate 10.

Figure 2:
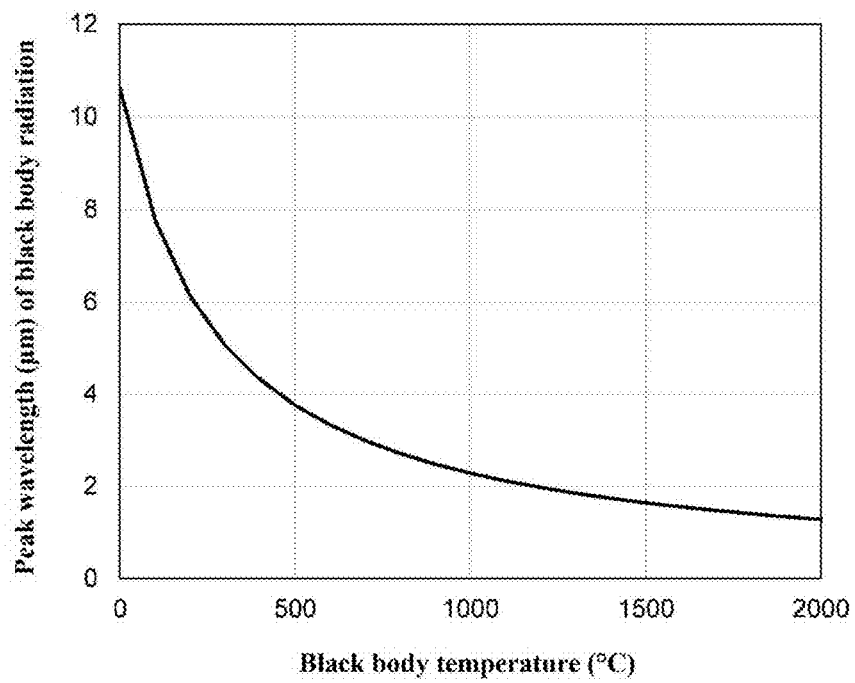
FIG. 2 is a view showing a Wien's displacement rule.

Here, FIG. 2 is a view showing a Wien's displacement rule. In FIG. 2, the horizontal axis indicates a black body temperature (° C.), and the vertical axis indicates a peak wavelength (μm) of black body radiation. According to Vienna's displacement law shown in FIG. 2, the peak wavelength of the black body radiation is inversely proportional to the black body temperature. The peak wavelength and the temperature have a relationship of $\lambda=2896/(T+273)$. Here, the peak wavelength is λ(μm) and the temperature is T (° C.). If radiation from a predetermined heating source in the step of heating the substrate 10 is assumed to be the black body radiation, the substrate 10 is irradiated with infrared rays having a peak wavelength corresponding to the heating temperature from the heating source. For example, when the temperature is about 1200° C., the peak wavelength λ of the infrared rays is 2 μm, and when the temperature is about 600° C., the peak wavelength λ of the infrared rays is 3.3 μm.

When the substrate 10 is irradiated with the infrared rays having such a wavelength, an absorption due to free electrons (free carrier absorption) occurs in the substrate 10. Thus, the substrate 10 is heated.

Therefore, in the present embodiment, the absorption coefficient of the substrate 10 in the infrared region satisfies the following predetermined requirements based on the free carrier absorption of the substrate 10.

Figure 3:
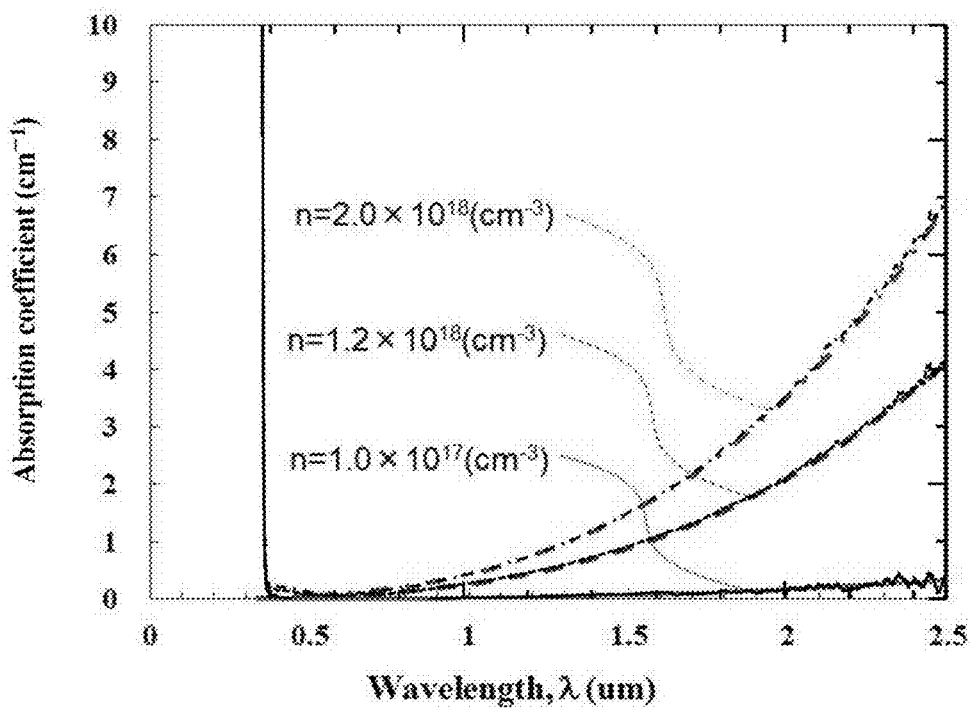
FIG. 3 is a view showing free electron concentration dependence of an absorption coefficient measured at room temperature (27° C.) in GaN crystal manufactured by a manufacturing method according to the first embodiment of the present invention.

FIG. 3 is a view showing free electron concentration dependence of an absorption coefficient measured at room temperature (27° C.) in GaN crystal manufactured by a manufacturing method according to an embodiment of the present invention. FIG. 3 also shows the measurement results of a substrate including a GaN crystal manufactured by Si doping by a manufacturing method described later. In FIG. 3, the horizontal axis indicates a wavelength (nm), and the vertical axis indicates an absorption coefficient $\alpha(cm^{-1})$ of the GaN crystal. A free electron concentration in the GaN crystal is n, and the absorption coefficient α of GaN crystal is plotted for each predetermined free electron concentration n. Further, as shown in FIG. 3, in the GaN crystal manufactured by a manufacturing method described later, the absorption coefficient α in the GaN crystal tends to increase (monotonously increases) toward a long wavelength, due to free carrier absorption in a wavelength range of at least 1 μm or more and 3.3 μm or less. Further, the free carrier absorption tends to increase in GaN crystal as the free electron concentration n in the GaN crystal increases.

Since the substrate 10 used in the present embodiment includes GaN crystal manufactured by the manufacturing method described later, the substrate 10 of the present embodiment is in a state of having small crystal strain (distortion), and hardly containing impurities other than oxygen (O) and n-type impurities (for example, impurities, etc., which compensate n-type impurities). Thereby, the free electron concentration dependency of the absorption coefficient like the above FIG. 3 is shown. As a result, in the substrate 10 of the present embodiment, the absorption coefficient in the infrared region can be approximately expressed as a function of the concentration of free carriers and the wavelength as follows.

Specifically, in the substrate 10 of the present embodiment, the absorption coefficient α in the wavelength range of at least 1 μm or more and 3.3 μm or less (preferably 1 μm or more and 2.5 μm or less) is approximately expressed by equation (1):

$$\alpha = nK\lambda^a \quad (1)$$

(wherein, λ(μm) is the wavelength,
α(cm$^{-1}$) is the absorption coefficient of the substrate 10 at 27° C.,
n (cm$^{-3}$) is the free electron concentration in the substrate 10, and
K and a are constants, satisfying $1.5 \times 10^{-19} \leq K \leq 6.0 \times 10^{-19}$, a=3).

"The absorption coefficient α is approximately expressed by equation (1)" means that the measured absorption coefficient α is approximately expressed by equation (1) by a least square method. That is, the above definition includes not only a case where the measured absorption coefficient completely matches equation (1) (ie, it satisfies equation (1)) but also a case where the measured absorption coefficient satisfies equation (1) within a predetermined error range. The predetermined error is, for example, within ±0.1α, preferably within ±0.01α at a wavelength of 2 μm.

The absorption coefficient α in the above wavelength range may be considered to satisfy formula (1)'.

$$1.5 \times 10^{-19} n\lambda^3 \leq \alpha \leq 6.0 \times 10^{-19} n\lambda^3 \quad (1)'$$

Further, among the substrates 10 which satisfy the above-described requirements, particularly, in a substrate having high quality, the absorption coefficient α in the above wavelength range is approximately expressed by the formula (1)" (which satisfies the formula (1)").

$$\alpha = 2.2 \times 10^{-19} n\lambda^3 \quad (1)''$$

Similarly to the above-described definition, the definition that "the absorption coefficient α is approximately expressed by the equation (1")" includes not only a case where the measured absorption coefficient completely matches the formula (1") (ie, it satisfies the formula (1")) but also a case where the measured absorption coefficient the formula (1") satisfies within a predetermined error range. The predetermined error is, for example, within ±0.1α, preferably within ±0.01α at a wavelength of 2 μm.

In the above-described FIG. 3, actual measurement values of the absorption coefficient α in the GaN crystal manufactured by the manufacturing method described later are indicated by a thin line. Specifically, the measurement value of the absorption coefficient α is indicated by a thin solid line when the free electron concentration n is $1.0 \times 10^{17}$ cm$^{-3}$, the measurement value of the absorption coefficient α is indicated by a thin dotted line when the free electron concentration n is $1.2 \times 10^{18}$ cm$^{-3}$, and the measurement value of the absorption coefficient α is indicated by a thin one dot chain line when the free electron concentration n is $2.0 \times 10^{18}$ cm$^{-3}$. On the other hand, in the above-described FIG. 3, the function of the above equation (1) is indicated by a thick line. Specifically, the function of equation (1) is indicated by a thick line when the free electron concentration n is $1.0 \times 10^{17}$ cm$^{-3}$, the function of equation (1) is indicated by a thick dotted line when the free electron concentration n is $1.2 \times 10^{18}$ cm$^{-3}$, and the function of equation (1) is indicated by a thick one dot chain line when the free electron concentration n is $2.0 \times 10^{18}$ cm$^{-3}$. As shown in FIG. 3, the measured value of the absorption coefficient α in the GaN crystal manufactured by the manufacturing method described later can be fitted with high accuracy by the function of equation (1). In the case of FIG. 3 (in the case of Si doping), the absorption coefficient α is accurately approximately expressed by equation (1) when K= $2.2 \times 10^{-19}$.

Thus, since the absorption coefficient of the substrate 10 is approximately expressed by equation (1), the absorption coefficient can be designed with high accuracy based on the concentration n of the free electrons in the substrate 10.

Further, in the present embodiment, for example, the absorption coefficient α of the substrate 10 satisfies equation (2) in a wavelength range of at least 1 μm or more and 3.3 μm or less.

$$0.15\lambda^3 \leq \alpha \leq 6\lambda^3 \quad (2)$$

In the case of $\alpha < 0.15\lambda^3$, infrared rays cannot be sufficiently absorbed by the substrate 10, and heating of the substrate 10 may become unstable. In contrast, by satisfying $0.15\lambda^3 \leq \alpha$, infrared rays can be sufficiently absorbed by the substrate 10, and the substrate 10 can be stably heated. On the other hand, in the case of $6\lambda_3 < \alpha$, this case corresponds to a case where the concentration of n-type impurities in the substrate 10 is more than a predetermined value (more than $1 \times 10^{19}$ at·cm$^{-3}$) as described later, and crystallinity of the substrate 10 may be reduced. In contrast, by satisfying $\alpha \leq 6\lambda^3$, this case corresponds to a case where the concentration of n-type impurities in the substrate 10 is a predetermined value or less, and good crystallinity of the substrate 10 can be secured.

The absorption coefficient α of the substrate 10 preferably satisfies formula (2)' or formula (2)".

$$0.15\lambda^3 \leq \alpha \leq 3\lambda^3 \quad (2)'$$

$$0.15\lambda^3 \leq \alpha \leq 1.2\lambda^3 \quad (2)''$$

Thereby, better crystallinity of the substrate 10 can be secured while enabling stable heating of the substrate 10.

Further, in the present embodiment, for example, Δα(cm$^{-1}$) satisfies equation (3) in a wavelength range of at least 1 μm or more and 3.3 μm or less:

$$\Delta\alpha \leq 1.0 \quad (3)$$

wherein, Δα is a difference between a maximum value and a minimum value of the absorption coefficient α in the main surface of the substrate 10.

(the difference obtained by subtracting the minimum value from the maximum value, hereinafter also referred to as "in-plane absorption coefficient difference of the substrate 10").

In the case of Δα>1.0, there is a possibility that a heating efficiency by irradiation with the infrared rays becomes non-uniform in the main surface of the substrate 10. In contrast, by satisfying Δα≤1.0, the heating efficiency by irradiation with the infrared rays can be uniform in the main surface of the substrate 10.

It is preferable that Δα satisfies formula (3)'.

$$\Delta\alpha \leq 0.5 \quad (3)'$$

By satisfying Δα≤0.5, the heating efficiency by irradiation with the infrared rays can be stably uniformized in the main surface of the substrate 10.

The definitions of formulas (2) and (3) regarding the absorption coefficient α and Δα may be replaced, for example, with the definitions at a wavelength of 2 μm.

Namely, in the present embodiment, for example, absorption coefficient at the wavelength of 2 μm in the substrate 10 is 1.2 cm$^{-1}$ or more and 48 cm$^{-1}$ or less. The absorption coefficient at the wavelength of 2 μm in the substrate 10 is preferably 1.2 cm$^{-1}$ or more and 24 cm$^{-1}$ or less, and more preferably 1.2 cm$^{-1}$ or more and 9.6 cm$^{-1}$ or less.

Further, in the present embodiment, for example, the difference between the maximum value and the minimum value of the absorption coefficient at the wavelength of 2 μm in the main surface of the substrate 10 is within 1.0 cm$^{-1}$, preferably within 0.5 cm$^{-1}$.

Although an upper limit value of the in-plane absorption coefficient difference of the substrate 10 has been described, the smaller the lower limit value of the in-plane absorption coefficient difference of the substrate 10, the better. Therefore, zero is preferable. Even if the in-plane absorption coefficient difference of the substrate 10 is 0.01 cm$^{-1}$, the effects of the present embodiment can be sufficiently obtained.

Here, a requirement for the absorption coefficient of the substrate 10 was defined at the wavelength of 2 μm, which corresponds to the infrared peak wavelength when the temperature is approximately 1200° C. However, the effect of satisfying the above requirements for the absorption coefficient of the substrate 10 is not limited to a case of setting the temperature to about 1200° C. This is because the spectrum of the infrared rays emitted from the heating source has a predetermined wavelength width in accordance with Stefan-Boltzmann's law, and has a component with a wavelength of 2 μm even if the temperature is other than 1200° C. Therefore, if the absorption coefficient of the substrate 10 satisfies the above requirements at a wavelength of 2 μm corresponding to the temperature of 1200° C., the absorption coefficient of the substrate 10 and the difference between the maximum value and the minimum value of the absorption coefficient in the main surface of the substrate 10 fall within a predetermined range, even at wavelengths where the temperature corresponds to other than 1200° C. Thereby, the substrate 10 can be stably heated, and the heating efficiency for the substrate 10 can be made uniform in the main surface, even if the temperature is not 1200° C.

The above-described FIG. 3 is the result of measuring the absorption coefficient of the GaN crystal at room temperature (27° C.). Therefore, when considering the absorption coefficient of the substrate 10 under a predetermined temperature condition in the step of heating the substrate 10, it is necessary to consider how the free carrier absorption of GaN crystal under a predetermined temperature condition changes relative to the free carrier absorption of GaN crystal under a temperature condition of room temperature.

Figure 4:
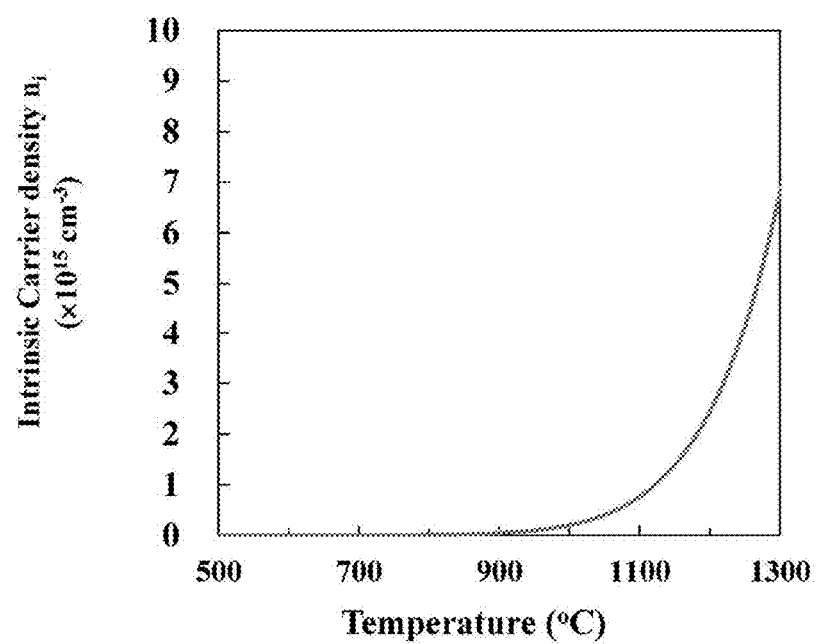
FIG. 4 is a graph showing an intrinsic carrier concentration with respect to a temperature of GaN crystal.

FIG. 4 is a view showing an intrinsic carrier concentration with respect to a temperature of GaN crystal. As shown in FIG. 4, in the GaN crystal constituting the substrate 10, the higher the temperature, the higher the concentration $n_i$ of intrinsic carriers thermally excited between bands (between the valence band and the conduction band). However, even if the temperature of the GaN crystal is around 1300° C., the concentration $n_i$ of intrinsic carriers thermally excited between the bands of the GaN crystal is less than 7×10$^{15}$ cm$^{-3}$, and is sufficiently lower than the concentration of free carriers (eg, 1×10$^{17}$ cm$^{-3}$) generated in the GaN crystal by doping with the n-type impurities. Namely, it can be said that the concentration of free carriers in the GaN crystal falls in a so-called extrinsic region in which the concentration of free carriers is determined by doping with the n-type impurities under a temperature condition where the temperature of the GaN crystal is less than 1300° C.

That is, in the present embodiment, the concentration of intrinsic carriers thermally excited between the bands of the substrate 10 under the temperature condition in the manufacturing step of at least the semiconductor laminate 1 or the semiconductor device 2 (under the temperature condition of, for example, room temperature (27° C.) or more and 1250° C. or less), is lower (for example, 1/10 times or less) than the concentration of free electrons generated in the substrate 10 by doping with the n-type impurities under the temperature condition of room temperature. Therefore, it can be considered that the concentration of free carriers of the substrate 10 under the predetermined temperature condition in the step of heating the substrate 10 is approximately equal to the concentration of free carriers of the substrate 10 under the room temperature condition, and it can be considered that the free carrier absorption under a predetermined temperature condition is approximately equal to the free carrier absorption at room temperature. Namely, as described above, when the absorption coefficient of the substrate 10 in the infrared region satisfies the predetermined requirements at room temperature, it can be considered that the absorption coefficient of the substrate 10 in the infrared region substantially maintains the predetermined requirements described above under a predetermined temperature condition as well.

Further, in the substrate 10 of the present embodiment, the absorption coefficient α in the wavelength range of at least 1 μm or more and 3.3 μm or less is approximately expressed by equation (1). Therefore, the absorption coefficient α of the substrate 10 has a relationship substantially proportional to the free electron concentration n at a predetermined wavelength λ.

Figure 5A:
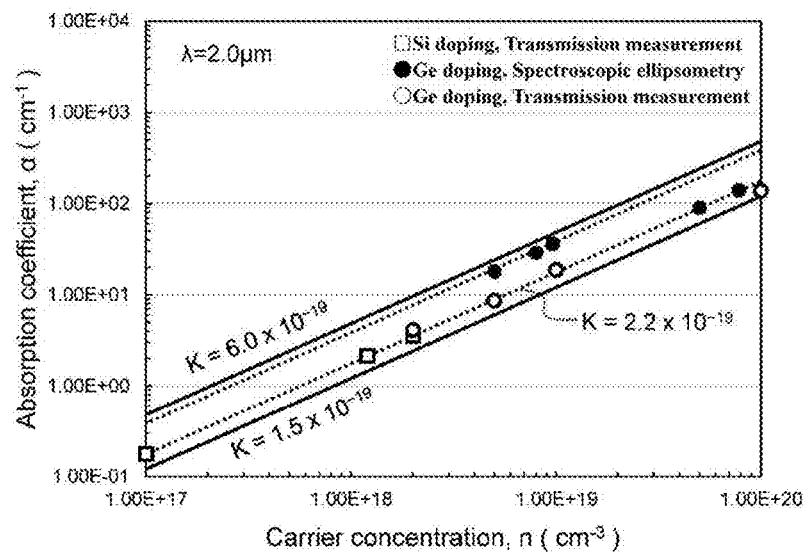
FIG. 5A is a view showing a relationship between an absorption coefficient at a wavelength of 2 μm and the free electron concentration in the GaN crystal manufactured by the manufacturing method according to the first embodiment of the present invention.

FIG. 5A is a view showing a relationship between an absorption coefficient at a wavelength of 2 μm and the free electron concentration in the GaN crystal manufactured by the manufacturing method according to an embodiment of the present invention. In FIG. 5A, a lower solid line (α=1.2× 10$^{-18}$ n) is a function obtained by substituting K=1.5×10$^{-19}$ and λ=2.0 into equation (1), and an upper solid line (α=4.8× 10$^{-18}$ n) is a function obtained by substituting K=6.0×10$^{-19}$ and λ=2.0 into equation (1). FIG. 5A also shows not only GaN crystal doped with Si, but also GaN crystal doped with Ge. FIG. 5A also shows the result of measuring the absorption coefficient by transmission measurement and the result of measuring the absorption coefficient by spectroscopic ellipsometry. As shown in FIG. 5A, when the wavelength λ is 2.0 μm, the absorption coefficient α of the GaN crystal manufactured by the manufacturing method described later has a relationship substantially proportional to the free electron concentration n. Further, the actual measured value of the absorption coefficient α in the GaN crystal manufactured by the manufacturing method described later can be fitted with high accuracy by the function of equation (1), within a range of 1.5×10$^{-19}$≤K≤6.0×10$^{-19}$. The GaN crystal manufactured by the manufacturing method described later has high quality. Therefore, the measured value of the absorption coefficient α can be fitted with high accuracy by the function of equation (1) when K=2.2×10$^{-19}$, ie, by α=1.8×10$^{-18}$ n.

In the present embodiment, the free electron concentration n in the substrate 10 satisfies the following predetermined requirements, based on the fact that the absorption coefficient α of the substrate 10 described above is proportional to the free electron concentration n.

In the present embodiment, for example, the free electron concentration n in the substrate 10 is 1.0×10$^{18}$ cm$^{-3}$ or more and 1.0×10$^{19}$ cm$^{-3}$ or less. Thereby, from the equation (1), the absorption coefficient of the substrate 10 at a wavelength of 2 μm can be 1.2 cm$^{-1}$ or more and 48 cm$^{-1}$ or less. The free electron concentration n in the substrate 10 is preferably 1.0×10$^{18}$ cm$^{-3}$ or more and 5.0×10$^{18}$ cm$^{-3}$ or less, and is more preferably $1.0\times10^{18}$ cm$^{-3}$ or more and $2.0\times10^{18}$ cm$^{-3}$ or less. Thereby, the absorption coefficient at a wavelength of 2 μm in the substrate 10 can be preferably 1.2 cm$^{-1}$ or more and 24 cm$^{-1}$ or less, and more preferably 1.2 cm$^{-1}$ or more and 9.6 cm$^{-1}$ or less.

Further, the following equation (4) can be obtained by differentiating equation (1):

$$\Delta\alpha = 8K\Delta n \quad (4)$$

wherein, $\Delta\alpha$ is the difference between the maximum value and the minimum value of the absorption coefficient $\alpha$ in the main surface of the substrate 10 as described above, $\Delta n$ is a difference between a maximum value and a minimum value of the free electron concentration n in the main surface of the substrate 10, and the wavelength $\lambda$ is 2.0 μm.

In the present embodiment, for example, the difference $\Delta n$ between the maximum value and the minimum value of the free electron concentration n in the main surface of the substrate 10 is within $8.3\times10^{17}$ cm$^{-3}$, and preferably within $4.2\times10^{17}$ cm$^{-3}$. Thereby, from the equation (4), the difference $\Delta\alpha$ between the maximum value and the minimum value of the absorption coefficient at a wavelength of 2 μm can be within 1.0 cm$^{-1}$, preferably within 0.5 cm$^{-1}$.

The upper limit value of $\Delta n$ has been described, and a lower limit value of $\Delta n$ is preferably zero, because the smaller the better. Even if $\Delta n$ is $8.3\times10^{15}$ cm$^{-3}$, the effects of the present embodiment can be sufficiently obtained.

In the present embodiment, the free electron concentration n in the substrate 10 is equal to the concentration of n-type impurities in the substrate 10, and the concentration of n-type impurities in the substrate 10 satisfies the following predetermined requirements.

In the present embodiment, for example, the concentration of the n-type impurities in the substrate 10 is $1.0\times10^{18}$ at·cm$^{-3}$ or more and $1.0\times10^{19}$ at·cm$^{-3}$ or less. Thereby, the free electron concentration n in the substrate 10 can be $1.0\times10^{18}$ cm$^{-3}$ or more and $1.0\times10^{19}$ cm$^{-3}$ or less. The concentration of the n-type impurities in the substrate 10 is preferably $1.0\times10^{18}$ at·cm$^{-3}$ or more and $5.0\times10^{18}$ at·cm$^{-3}$ or less, and more preferably $1.0\times10^{18}$ at·cm$^{-3}$ or more and $2.0\times10^{18}$ at·cm$^{-3}$ or less. Thereby, the free electron concentration n in the substrate 10 can be preferably $1.0\times10^{18}$ cm$^{-3}$ or more and $5.0\times10^{18}$ cm$^{-3}$ or less, and more preferably $1.0\times10^{18}$ cm$^{-3}$ or more and $2.0\times10^{18}$ cm$^{-3}$ or less.

Further, in the present embodiment, for example, a difference between a maximum value and a minimum value of the concentration of the n-type impurities in the main surface of the substrate 10 (hereinafter, also referred to as in-plane concentration difference of the n-type impurities) is within $8.3\times10^{17}$ at·cm$^{-3}$, preferably within $4.2\times10^{17}$ at·cm$^{-3}$. Thereby, the difference $\Delta n$ between the maximum value and the minimum value of the free electron concentration n in the main surface of the substrate 10 can be equal to the in-plane concentration difference of the n-type impurities, and can be $8.3\times10^{17}$ cm$^{-3}$ or less, preferably $4.2\times10^{17}$ cm$^{-3}$ or less.

The upper limit value of the in-plane concentration difference of n-type impurities has been described, and a lower limit value of in-plane concentration difference of the n-type impurity is preferably zero, because the smaller the better. Even if the in-plane concentration difference of the n-type impurities is $8.3\times10^{15}$ at·cm$^{-3}$, the effects of the present embodiment can be sufficiently obtained.

Further, in the present embodiment, the concentration of each element in the substrate 10 satisfies the following predetermined requirements.

In the present embodiment, among Si, Ge and O used as n-type impurities, the concentration of O is extremely low, whose control of an amount of addition is relatively difficult, and the concentration of n-type impurities in the substrate 10 is determined by a total concentration of Si and Ge whose control of an amount of addition is relatively easy.

Namely, the concentration of O in the substrate 10 is negligibly low, for example, ⅒ or less relative to a total concentration of Si and Ge in the substrate 10. Specifically, for example, the concentration of O in the substrate is less than $1\times10^{17}$ at·cm$^{-3}$, and meanwhile the total concentration of Si and Ge in the substrate 10 is $1\times10^{18}$ at·cm$^{-3}$ or more and $1.0\times10^{19}$ at·cm$^3$ or less. Thereby, the concentration of n-type impurities in the substrate 10 can be controlled by the total concentration of Si and Ge, whose control of an amount of addition is relatively easy. As a result, the free electron concentration n in the substrate 10 can be controlled accurately so as to be equal to the total concentration of Si and Ge in the substrate 10, and the difference $\Delta n$ between the maximum value and the minimum value of the concentration of free electrons in the main surface of the substrate 10 can be controlled accurately so as to satisfy predetermined requirements.

Further, in the present embodiment, the concentration of impurities other than n-type impurities in the substrate 10 is negligibly low, for example, ⅒ or less relative to the concentration of n-type impurities in the substrate 10 (namely, the total concentration of Si and Ge in the substrate 10). Specifically, for example, the concentration of impurities other than n-type impurities in the substrate 10 is less than $1\times10^{17}$ at·cm$^{-3}$. Thereby, an inhibiting factor for the generation of free electrons from n-type impurities can be reduced. As a result, the free electron concentration n in the substrate 10 can be accurately controlled so as to be equal to the concentration of n-type impurities in the substrate 10, and the difference $\Delta n$ between the maximum value and the minimum value of the concentration of free electrons in the main surface of the substrate 10 can be controlled so as to satisfy predetermined requirements.

The inventor of the present invention confirms as follows: since a manufacturing method described later is adopted, the concentration of each element in the substrate 10 can be stably controlled so as to satisfy the above requirements.

According to the manufacturing method described later, it is found that each concentration of O and carbon (C) in the substrate 10 can be reduced to less than $5\times10^{15}$ at·cm$^{-3}$, and further each concentration of iron (Fe), chromium (Cr), boron (B), etc., in the substrate 10 can be reduced to less than $1\times10^{15}$ at·cm$^{-3}$. Further, according to this method, it is found that each concentration of elements other than the above elements can also be reduced to a concentration less than the lower limit of detection by secondary ion mass spectrometry (SIMS) measurement.

Further, since the absorption coefficient due to free carrier absorption in the substrate 10 manufactured by a manufacturing method described later according to the present embodiment is smaller than that of the conventional substrate, it is estimated that a mobility (μ) in the substrate 10 of the present embodiment is higher than that of a conventional substrate. Thereby, even when the free electron concentration in the substrate 10 of the present embodiment is equal to that of the conventional substrate, the resistivity ($\rho=1/en\mu$) of the substrate 10 of the present embodiment is lower than that of the conventional substrate. Specifically, when the free electron concentration n in the substrate 10 is $1.0\times10^{18}$ cm$^{-3}$ or more and $1.0\times10^{19}$ cm$^{-3}$ or less, the resistivity of the substrate 10 is, for example, 2.2 mΩ·cm or more and 17.4 mΩ·cm or less.

(2) Semiconductor Laminate

Figure 6:
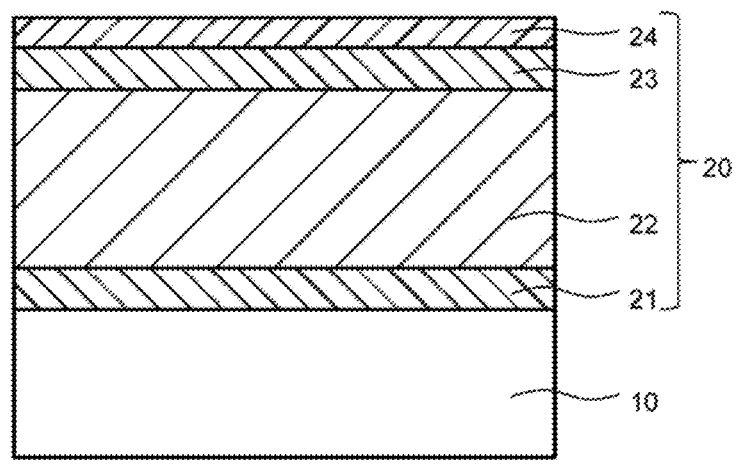
FIG. 6 is a schematic cross-sectional view showing a semiconductor laminate 1 according to the first embodiment of the present invention.

Next, with reference to FIG. 6, a semiconductor laminate (a crystal laminate) 1 according to the present embodiment will be described. FIG. 6 is a schematic cross-sectional view showing a semiconductor laminate 1 according to the present embodiment.

First, an overview of the semiconductor laminate 1 of the present embodiment will be described.

As shown in FIG. 6, the semiconductor laminate 1 of the present embodiment is configured as a plate-like intermediate used when manufacturing a semiconductor device 2 described later. The semiconductor laminate 1 includes, for example, the substrate 10, and a semiconductor layer (a semiconductor laminate structure, a semiconductor laminated body, or an epitaxial growth layer) 20.

The substrate 10 is the nitride crystal substrate described above, and the absorption coefficient of substrate 10 in the infrared region satisfies the above requirements.

The semiconductor layer 20 is formed by epitaxially growing on the main surface of the substrate 10. The semiconductor layer 20 includes a single crystal of group-III nitride semiconductor, and in the present embodiment, includes, for example, a single crystal of GaN, similarly to the substrate 10.

In the present embodiment, a surface (main surface) of the semiconductor layer 20 satisfies predetermined requirements for a reflectance in an infrared region satisfies predetermined requirements. Specifically, the reflectance of the surface of the semiconductor layer 20 is 5% or more and 30% or less in a wavelength range of at least 1 μm or more and 3.3 μm or less. Therefore, infrared rays can sufficiently reach to the substrate 10, in the step of heating the substrate 10 (the semiconductor laminate 1). As a result, the substrate 10 can be stably heated.

A surface roughness (arithmetic mean roughness Ra) of the surface of the semiconductor layer 20 is, for example, 1 nm or more and 30 nm or less. Therefore, the reflectance of the surface of the semiconductor layer 20 can be 5% or more and 30% or less in the wavelength range of at least 1 μm or more and 3.3 μm or less.

Next, a specific configuration of the semiconductor laminate 1 of the present embodiment will be described.

The semiconductor laminate 1 of the present embodiment is configured as an intermediate used when manufacturing a semiconductor device 2 as a high breakdown voltage p-n junction diode, for example. The semiconductor layer 20 in the semiconductor laminate 1 has, for example, a laminate structure. Specifically, the semiconductor layer 20 includes, for example, an underlying n-type semiconductor layer 21, a drift layer 22, a first p-type semiconductor layer 23, and a second p-type semiconductor layer 24.

(Underlying n-Type Semiconductor Layer)

The underlying n-type semiconductor layer 21 is provided to contact with the main surface of the substrate 10, as a buffer layer for taking over the crystallinity of the substrate 10 and stably epitaxially growing the drift layer 22. The underlying n-type semiconductor layer 21 is configured as an n-type GaN layer containing n-type impurities. Examples of the n-type impurities contained in the underlying n-type semiconductor layer 21 include Si and Ge, similarly to the n-type impurities in the substrate 10. The concentration of the n-type impurities in the underlying n-type semiconductor layer 21 is approximately equal to that of the substrate 10, and is, for example, $1.0 \times 10^{18}$ at·cm$^{-3}$ or more and $1.0 \times 10^{19}$ at·cm$^3$ or less.

A thickness of the underlying n-type semiconductor layer 21 is smaller than a thickness of the drift layer 22, and is, for example, 0.1 μm or more and 3 μm or less.

(Drift Layer)

The drift layer 22 is provided on the underlying n-type semiconductor layer 21, and is configured as an n-type GaN layer containing the n-type impurities in a low concentration. Examples of the n-type impurities contained in the drift layer 22 include Si and Ge, similarly to the n-type impurities in the underlying n-type semiconductor layer 21.

The concentration of the n-type impurities in the drift layer 22 is lower than that of each of the substrate 10 and the underlying n-type semiconductor layer 21, and is, for example, $1.0 \times 10^{15}$ at·cm$^{-3}$ or more and $5.0 \times 10^{16}$ at·cm$^3$ or less. By setting the concentration of the n-type impurities in the drift layer 22 to $1.0 \times 10^{15}$ at·cm$^{-3}$ or more, an on-resistance of the semiconductor device 2 can be decreased. Meanwhile, by setting the concentration of the n-type impurities in the drift layer 22 to $5.0 \times 10^{16}$ at·cm$^3$ or less, a predetermined breakdown voltage can be secured.

The drift layer 22 is, for example, provided to be thicker than the underlying n-type semiconductor layer 21, in order to improve the breakdown voltage of the semiconductor device 2. Specifically, a thickness of the drift layer 22 is, for example, 3 μm or more and 40 μm or less. By setting the thickness of the drift layer 22 to 3 μm or more, the predetermined breakdown voltage can be secured. Meanwhile, by setting the thickness of the drift layer 22 to 40 μm or less, the on-resistance of the semiconductor device 2 can be decreased.

(First p-Type Semiconductor Layer)

The first p-type semiconductor layer 23 is provided on the drift layer 22, and is configured as a p-type GaN layer containing p-type impurities (acceptors). Example of the p-type impurities contained in the first p-type semiconductor layer 23 includes magnesium (Mg). The concentration of the p-type impurities in the first p-type semiconductor layer 23 is, for example, $1.0 \times 10^{17}$ at·cm$^{-3}$ or more and $2.0 \times 10^{19}$ at·cm$^{-3}$ or less.

A thickness of the first p-type semiconductor layer 23 is smaller than a thickness of the drift layer 22, and is, for example, 100 nm or more and 500 nm or less.

(Second p-Type Semiconductor Layer)

The second p-type semiconductor layer 24 is provided on the first p-type semiconductor layer 23, and is configured as a p-type GaN layer containing p-type impurities in a high concentration. Example of the p-type impurities contained in the second p-type semiconductor layer 24 includes Mg, similarly to the first p-type semiconductor layer 23. The concentration of the p-type impurities in the second p-type semiconductor layer 24 is higher than that of the first p-type semiconductor layer 23, and is, for example, $5.0 \times 10^{19}$ at·cm$^{-3}$ or more and $2.0 \times 10^{20}$ at·cm$^{-3}$ or less. By setting the concentration of the p-type impurities in the second p-type semiconductor layer 24 within the above range, a contact resistance between the second p-type semiconductor layer 24 and an anode described later can be decreased.

A thickness of the second p-type semiconductor layer 24 is smaller than a thickness of the first p-type semiconductor layer 23, and is, for example, 10 nm or more and 50 nm or less.

Figure 7:
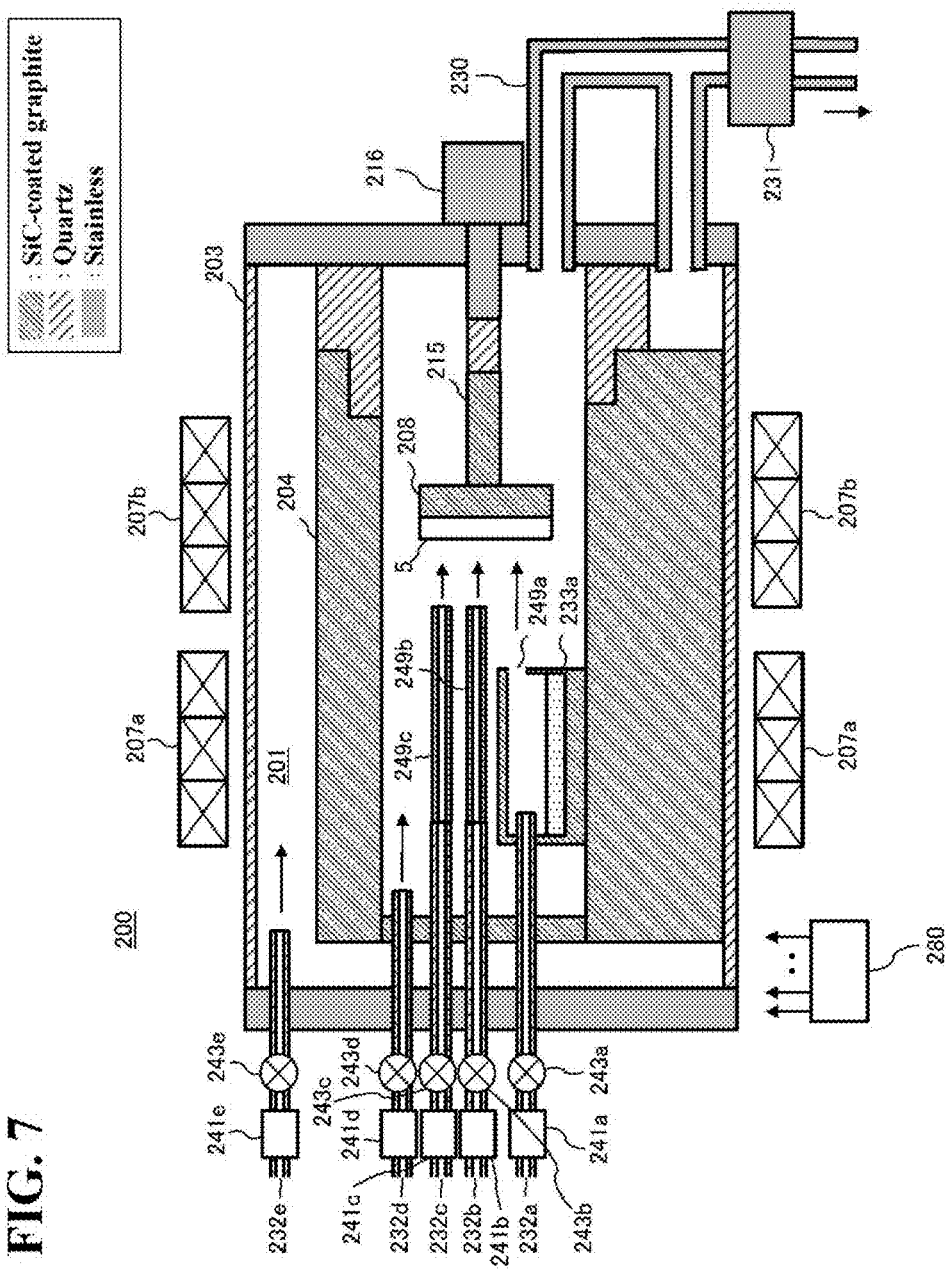
FIG. 7 is a schematic block diagram of a vapor phase growth apparatus 200.
Figure 8A:
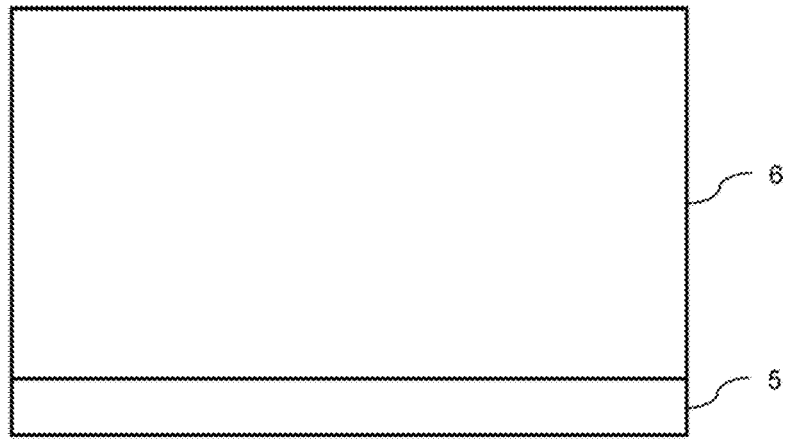
FIG. 8A is a view showing how the GaN crystal film 6 is grown thick on a seed crystal substrate 5.
Figure 8B:
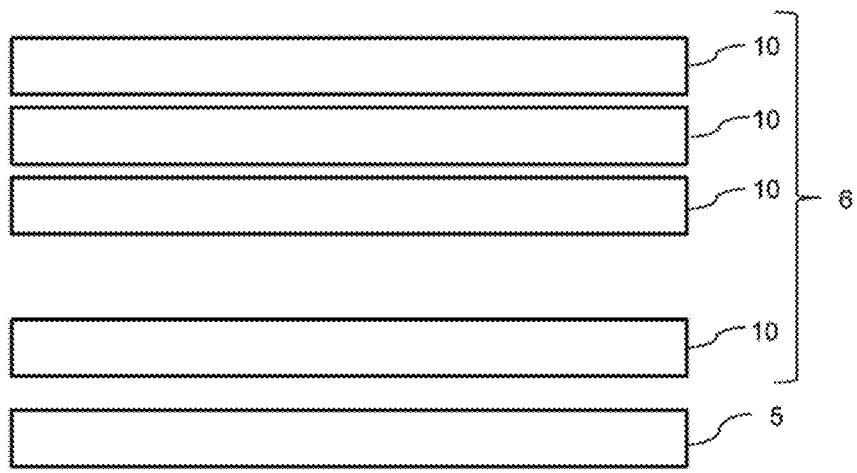
FIG. 8B is a view showing how a plurality of nitride crystal substrates 10 are obtained by slicing a thickly grown GaN crystal film 6.
Figure 9A:
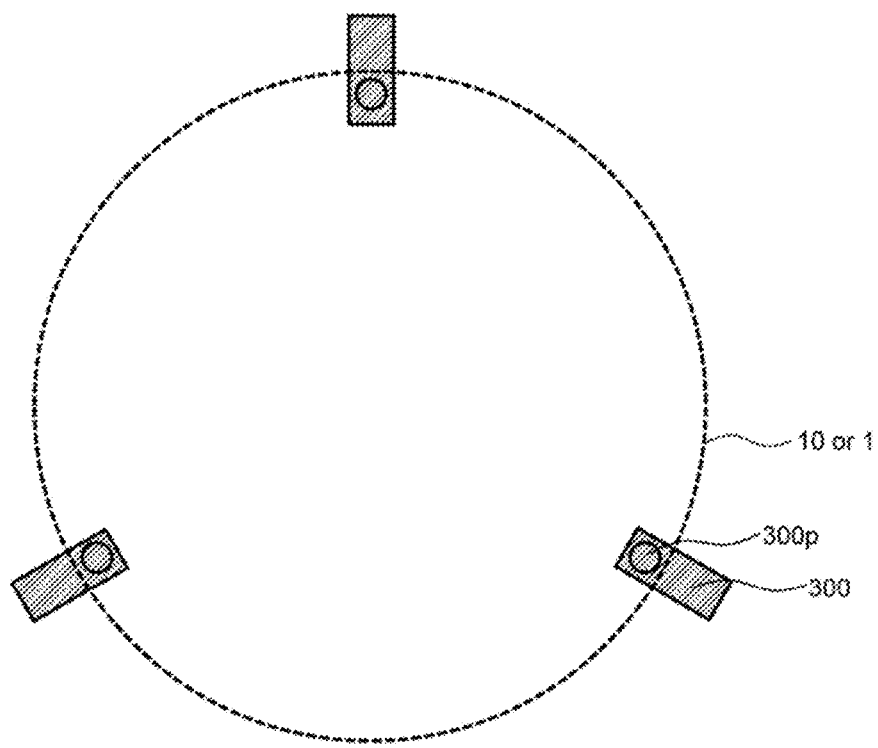
FIG. 9A is a schematic top view showing a holding member 300 on which the nitride crystal substrate 10 or a semiconductor laminate 1 is placed.
Figure 9B:
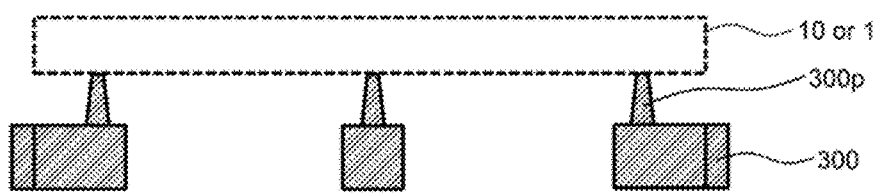
FIG. 9B is a schematic frontal view showing a holding member 300 on which the nitride crystal substrate 10 or the semiconductor laminate 1 is placed.
Figure 10A:
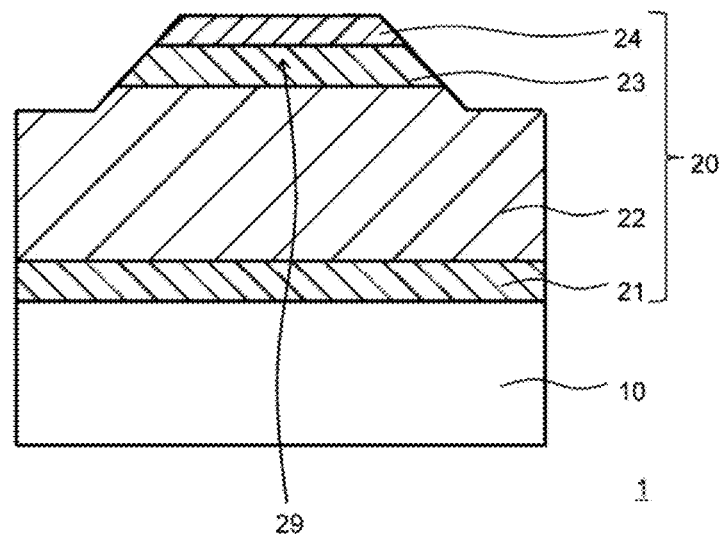
FIGS. 10A and 10B are schematic cross-sectional views showing a manufacturing step of a semiconductor device.
Figure 10B:
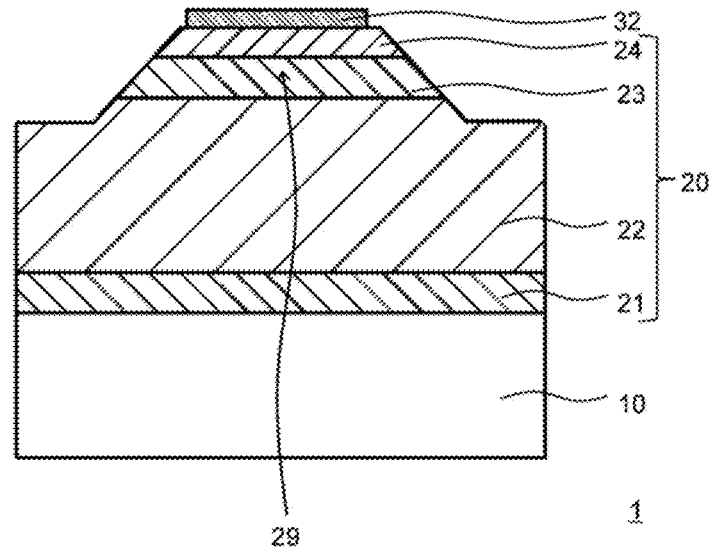
Figure 11A:
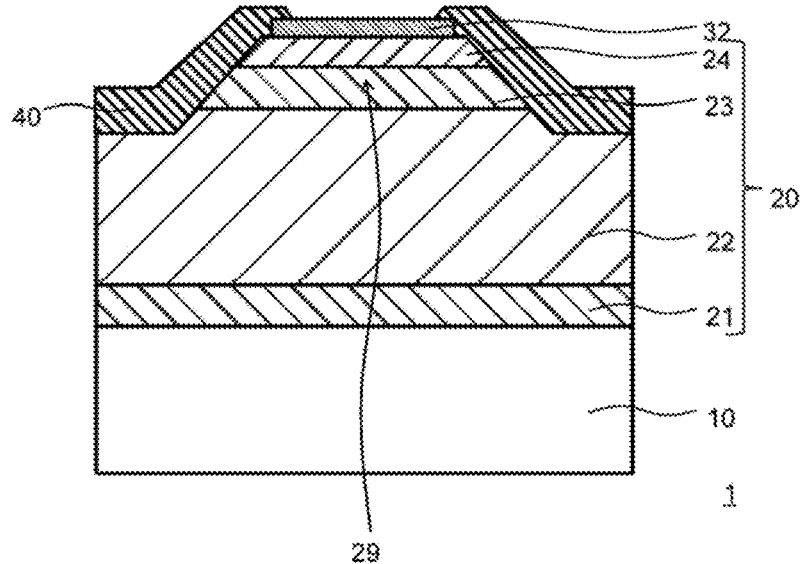
FIGS. 11A and 11B are schematic cross-sectional views showing a manufacturing step of a semiconductor device.
Figure 11B:
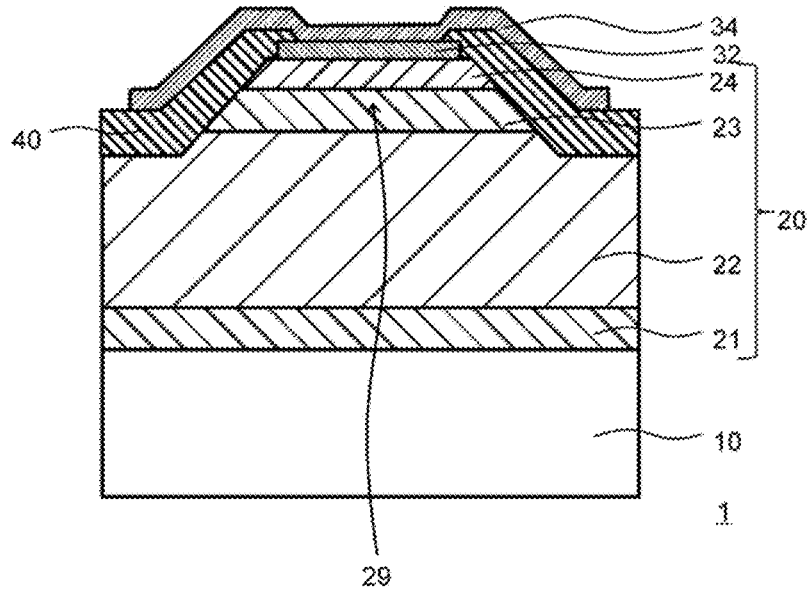
Figure 12:
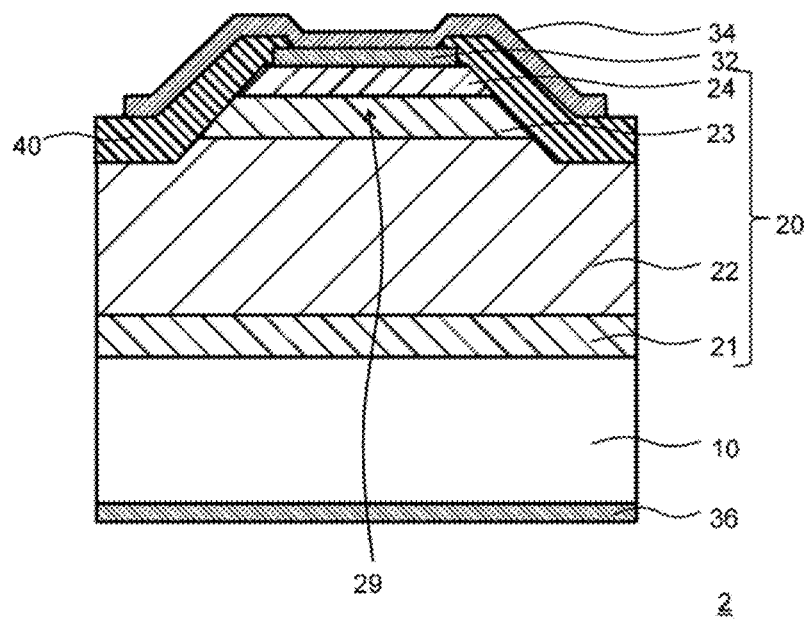
FIG. 12 is a schematic cross-sectional view showing the semiconductor device 2 according to the first embodiment of the present invention.

(3) Method for Manufacturing a Semiconductor Laminate and Method for Manufacturing a Semiconductor Device Next, with reference to FIG. 6 to FIG. 12, a method for manufacturing a semiconductor laminate 1 and a method for manufacturing a semiconductor device 2 according to the present embodiment will be described. FIG. 7 is a schematic block diagram of a vapor phase growth apparatus 200. FIG. 8A is a view showing how the GaN crystal film 6 is grown thick on a seed crystal substrate 5, and FIG. 8B is a view showing how a plurality of nitride crystal substrates 10 are obtained by slicing a thickly grown GaN crystal film 6. FIG. 9A is a schematic top view showing a holding member 300 on which the nitride crystal substrate 10 or a semiconductor laminate 1 is placed, and FIG. 9B is a schematic frontal view showing a holding member 300 on which the nitride crystal substrate 10 or the semiconductor laminate 1 is placed. FIGS. 10A and 10B are schematic cross-sectional views showing a manufacturing step of a semiconductor device. FIGS. 11A and 11B are schematic cross-sectional views showing a manufacturing step of a semiconductor device. FIG. 12 is a schematic cross-sectional view showing the semiconductor device 2 according to the present embodiment. Hereinafter, a step is abbreviated as S.

(S110: Substrate Preparing Step)

First, a substrate preparing step S110 of preparing the substrate 10 is performed. The substrate preparing step S110 of the present embodiment includes, for example, a substrate manufacturing step S112, a measuring step S114, and a determining step S116.

(S112: Substrate Manufacturing Step)

The substrate 10 is manufactured, using a hydride vapor phase epitaxy apparatus (HVPE apparatus) 200 shown below.

(Configuration of HVPE Apparatus)

The configuration of the HVPE apparatus (the vapor phase growth apparatus) 200 used to manufacture the substrate 10 will be described in detail with reference to FIG. 7.

The HVPE apparatus 200 includes a reaction vessel (an airtight vessel) 203 in which a film forming chamber (a reaction chamber) 201 is constituted. In the film forming chamber 201, an inner cover 204 is provided, and a susceptor 208 as a base on which a seed crystal substrate (hereinafter, also referred to as a seed substrate) 5 is disposed is provided at a position surrounded by the inner cover 204. The susceptor 208 is connected to a rotation shaft 215 of a rotation mechanism 216, and is configured to be rotatable according to a drive of the rotation mechanism 216.

A gas supply pipe 232a for supplying hydrogen chloride (HCl) gas into a gas generator 233a, a gas supply pipe 232b for supplying ammonia ($NH_3$) gas into an inside of the inner cover 204, a gas supply pipe 232c for supplying a doping gas described later into the inside of the inner cover 204, a gas supply pipe 232d for supplying mixed gas ($N_2/H_2$ gas) of nitrogen ($N_2$) gas and hydrogen ($H_2$) gas as a purge gas into the inside of the inner cover 204, and a gas supply pipe 232e for supplying $N_2$ gas as a purge gas into the film forming chamber 201, are connected to one end of the reaction vessel 203. Flow controllers 241a to 241e and valves 243a to 243e are provided, respectively on the gas supply pipes 232a to 232e, sequentially from an upstream side. A gas generator 233a containing Ga melt as a raw material is provided on a downstream of the gas supply pipe 232a. A nozzle 249a is provided in the gas generator 233a, for supplying gallium chloride (GaCl) gas generated by a reaction of HCl gas and Ga melt toward the seed substrate 5 and the like disposed on the susceptor 208. Nozzles 249b and 249c are connected respectively on the downstream of the gas supply pipes 232b and 232c, for supplying various gases supplied from these gas supply pipes toward the seed substrate 5 and the like disposed on the susceptor 208. The nozzles 249a to 249c are disposed to flow the gas in a direction intersecting the surface of the susceptor 208. Doping gas supplied from the nozzle 249c is a mixed gas of a doping source gas and a carrier gas such as $N_2/H_2$ gas. The doping gas may be flowed together with HCl gas for the purpose of suppressing a thermal decomposition of a halide gas of a doping material. As a doping source gas constituting the doping gas, for example, dichlorosilane ($SiH_2Cl_2$) gas or silane ($SiH_4$) gas in the case of silicon (Si) doping, tetrachlorogermane ($GeCl_4$) gas, dichlorogermane ($GeH_2Cl_2$) gas or germane ($GeH_4$) gas in the case of germanium (Ge) doping, may be respectively used. However, the present invention is not limited to these gases.

An exhaust pipe 230 is provided at the other end of the reaction vessel 203, for exhausting inside of the film forming chamber 201. A pump (or blower) 231 is provided on the exhaust pipe 230. Zone heaters 207a and 207b are provided on the outer periphery of the reaction vessel 203, for heating for each region such as an inside of the gas generator 233a, the seed substrate 5 on the susceptor 208, and the like to a desired temperature. Further, a temperature sensor (not shown) is provided in the reaction vessel 203, for measuring the temperature in the film forming chamber 201.

The constituent members of the HVPE apparatus 200 described above, particularly, the respective members for forming the flow of the various gases, are configured for example as described below, in order to enable crystal growth with low impurity concentration as described later.

Specifically, as shown distinguishably by hatching types in FIG. 7, it is preferable to use a member containing a quartz-free and boron-free material, as a member constituting a high temperature region which is a region in the reaction vessel 203 heated to a crystal growth temperature (for example, 1000° C. or more) by receiving radiation from the zone heaters 207a and 207b, and which is a gas contact region of a gas supplied to the seed substrate 5. Specifically, for example, it is preferable to use a member containing silicon carbide (SiC)-coated graphite, as a member constituting the high temperature region. On the other hand, in a relatively low temperature region, it is preferable to constitute the member using high-purity quartz. Namely, in the high temperature region where it is relatively hot and in contact with HCl gas etc., each member is constituted using the SiC-coated graphite without using the high-purity quartz. Specifically, the inner cover 204, susceptor 208, rotating shaft 215, gas generator 233a, nozzles 249a to 249c, etc., are constituted using the SiC-coated graphite. Since a furnace core tube constituting the reaction vessel 203 can only be constituting using quartz, the inner cover 204 is provided in the film forming chamber 201, for surrounding the susceptor 208, the gas generator 233a, and the like. The wall part at the both ends of the reaction vessel 203, the exhaust pipe 230, etc., may be constituted using metal materials, such as stainless steel.

For example, "Polyakov et al. J. Appl. Phys. 115, 183706 (2014)" discloses that growth at 950° C. enables growth of a low impurity concentration GaN crystal. However, such a low-temperature growth leads to a decrease in the quality of the crystal obtained, and it is not possible to obtain a good thermophysical property, a good electrical property, and the like.

In contrast, according to the above-described HVPE apparatus 200 of the present embodiment, each member is constituted using the SiC-coated graphite in the high temperature region where it is relatively hot and in contact with HCl gas, etc. Thereby, for example, even in a temperature range suitable for the growth of GaN crystal of 1050° C. or more, supply of impurities to a crystal growth portion can be blocked, the impurities being Si, O, C, Fe, Cr, Ni, etc., derived from quartz, stainless steel, and the like. As a result, it is feasible to grow the GaN crystal having high purity and excellent properties in thermophysical properties and electrical properties.

Each member included in the HVPE apparatus 200 is connected to a controller 280 constituted as a computer, and a processing procedure and a processing condition described later are controlled by a program executed on the controller 280.

(Manufacturing Step of the Substrate 10)

Next, a series of processes for epitaxially growing a GaN crystal on the seed substrate 5 using the above HVPE apparatus 200 and thereafter obtaining the substrate 10 by slicing the grown crystal, will be described in detail with reference to FIG. 7. In the following explanation, the operation of each part constituting the HVPE apparatus 200 is controlled by the controller 280.

The manufacturing step of the substrate 10 includes a loading step, a crystal growth step, an unloading step a slicing step.

(Loading Step)

Specifically, first, a furnace port of the reaction vessel 203 is opened, and the seed substrate 5 is placed on the susceptor 208. The seed substrate 5 placed on the susceptor 208 becomes a base (seed) for manufacturing the substrate 10 described later, and is a plate including a single crystal of GaN which is an example of a nitride semiconductor.

In placing the seed substrate 5 on the susceptor 208, the surface of the seed substrate 5 placed on the susceptor 208, namely, the main surface (crystal growth surface, base surface) on the side facing the nozzles 249a to 249c is (0001) plane of the GaN crystal, namely, +C plane (Ga polar plane).

(Crystal Growth Step)

In this step, after loading of the seed substrate 5 into the film forming chamber 201 is completed, the furnace port is closed, and supply of $H_2$ gas or $H_2$ gas and $N_2$ gas into the film forming chamber 201 is started while heating and exhausting inside of the film forming chamber 201. Then, in a state where temperature and pressure inside of the film forming chamber 201 reaches a desired processing temperature and processing pressure, and atmosphere in the film forming chamber 201 becomes a desired atmosphere, supply of HCl gas and $NH_3$ gas is started from the gas supply pipes 232a and 232b, and GaCl gas and $NH_3$ gas are respectively supplied to the surface of the seed substrate 5.

Thereby, as shown in a sectional view in FIG. 8A, the GaN crystal is epitaxially grown on the surface of the seed substrate 5 in the c-axis direction, and GaN crystal 6 is formed. At this time, by supplying $SiH_2Cl_2$ gas, it is possible to add Si as an n-type impurity into the GaN crystal 6.

In this step, in order to prevent thermal decomposition of the GaN crystals constituting the seed substrate 5, it is preferable to start supply of the $NH_3$ gas into the film forming chamber 201 when the temperature of the seed substrate 5 reaches 500° C. or before that time. Further, in order to improve the in-plane uniformity of the film thickness of the GaN crystal 6, this step is preferably performed with the susceptor 208 rotated.

In this step, regarding the temperature of the zone heaters 207a and 207b, the temperature in the heater 207a that heats an upstream portion in the film forming chamber 201 including the gas generator 233a is preferably set to, for example, a temperature from 700 to 900° C., and the temperature in the heater 207b that heats a downstream portion in the film forming chamber 201 including the susceptor 208 is preferably set to, for example, a temperature from 1000 to 1200° C. Thereby, the temperature of the susceptor 208 is adjusted to a predetermined temperature of 1000 to 1200° C. In this step, an internal heater (not shown) may be used in off state, but temperature control may be performed using an internal heater, as long as the temperature of the susceptor 208 is in a range from 1000 to 1200° C.

Other processing conditions of this step are shown below.
Processing pressure: 0.5 to 2 atm
GaCl gas partial pressure: 0.1 to 20 kPa
$NH_3$ gas partial pressure/GaCl gas partial pressure: 1 to 100
$H_2$ gas partial pressure/GaCl gas partial pressure: 0 to 100
$SiH_2Cl_2$ gas partial pressure: $2.5 \times 10^{-5}$ to $1.3 \times 10^{-3}$ kPa Further, when supplying GaCl gas and $NH_3$ gas to the surface of the seed substrate 5, $N_2$ gas as a carrier gas may be added from each of the gas supply pipes 232a to 232b. Since $N_2$ gas is added and the flow rate of the gas supplied from the nozzles 249a to 249b is adjusted, the distribution of a supply amount of the source gas on the surface of the seed substrate 5 is appropriately controlled, and a uniform growth rate distribution can be realized over an entire surface. A noble gas (rare gas) such as Ar gas or He gas may be added instead of $N_2$ gas.

(Unloading Step)

When the GaN crystal 6 having a desired thickness is grown on the seed substrate 5, supply of the HCl gas to the gas generator 233a, supply of the $H_2$ gas into the film forming chamber 201, and heating by the zone heaters 207a and 207b are respectively stopped, while supplying $NH_3$ gas and $N_2$ gas into the film forming chamber 201, with the film forming chamber 201 exhausted. Then, when the temperature in the film forming chamber 201 is lowered to 500° C. or less, supply of the $NH_3$ gas is stopped, and the atmosphere in the film forming chamber 201 is replaced with $N_2$ gas, to return its pressure to the atmospheric pressure. Then, the temperature inside of the film forming chamber 201 is lowered to, for example, 200° C. or less, namely, to a temperature at which the crystal ingot of GaN (seed substrate 5 with the GaN crystal 6 formed on the main surface) can be unloaded from the reaction vessel 203. Thereafter, the crystal ingot is unloaded from the film forming chamber 201 to outside.

(Slicing Step)

Thereafter, the unloaded crystal ingot is sliced, for example, in a direction parallel to a growth surface of the GaN crystal 6. Thereby, as shown in FIG. 8B, one or more substrates 10 can be obtained. Since various compositions and various physical properties of the substrate 10 are as described above, description thereof is omitted. A slicing process can be performed using, for example, a wire saw or an electric discharge machine, etc. The thickness of the substrate 10 is 250 μm or more, for example, about 400 μm. Thereafter, by performing a predetermined polishing process on the surface (+c plane) of the substrate 10, this surface becomes an epi-ready mirror surface. A back surface (−c plane) of the substrate 10 is set to a lapped surface or a mirror surface.

(S114: Measuring Step)

After a plurality of the substrates 10 are manufactured, a light is irradiated to each of the plurality of the substrates 10, and an absorption coefficient in an infrared region is measured in each of the plurality of the substrates 10. At this time, the absorption coefficients in the infrared region are measured, at least at two or more points in the main surface of the substrate 10. At this time, measurement points in the main surface of the substrate 10 are 2 points or more and 10 points or less, preferably 3 points or more and 5 points or less. When the measurement point is only one point, an absorption coefficient difference in the main surface of the substrate 10 cannot be obtained. Meanwhile, when the measurement points are more than 10 points, a time of the measuring step may become long, and productivity of the substrate 10 may be reduced.

It is preferable to measure the absorption coefficient at least at the center of the main surface of the substrate 10 and at a position radially away from the center of the main surface of the substrate 10 by a predetermined distance. Here, since the GaN crystal is grown while rotating the seed substrate 5 in the above substrate manufacturing step S112, the absorption coefficient tends to be concentrically equal, centering on the center of the main surface of the substrate 10. Accordingly, by measuring the absorption coefficient at least at the center of the main surface of the substrate 10 and at a position radially away from the center of the main surface of the substrate 10 by a predetermined distance, a distribution of the absorption coefficient in the main surface of the substrate 10 can be accurately grasped (predicted). The measurement position other than the center of the main surface of the substrate 10 is, for example, a position radially away from the center of the main surface of the substrate 10 by a distance of 20% or more and 80% or less relative to a radius of the substrate 10.

(S116: Determining Step)

Next, it is determined whether the substrate 10 satisfies predetermined requirements for the absorption coefficient in the infrared region or not, based on the measured absorption coefficient of the substrate 10. Specifically, it is determined whether the absorption coefficient α is approximately expressed by the above equation (1) in the wavelength range of at least 1 µm or more and 3.3 µm or less, for example. Or, it is determined whether the absorption coefficient of the substrate 10 at the wavelength of 2 µm is 1.2 cm$^{-1}$ or more and 48 cm$^{-1}$ or less, and whether the difference between the maximum value and the minimum value of the absorption coefficient at the wavelength of 2 µm in the main surface of the substrate 10 is within 1.0 cm$^{-1}$. At this time, the above determination is performed for each of the plurality of the substrates 10 obtained in the substrate manufacturing step S112.

Next, based on the above determination result, among the plurality of the substrates 10, the substrate 10 satisfying the above requirements for the absorption coefficient in the infrared region is selected as a good product, and on the other hand, the substrate 10 not satisfying the above requirements is excluded. Therefore, the substrate 10 that can be heated with high accuracy and good reproducibility in the step of heating the substrate 10 described later, can be selected as a good product. And, the substrate 10 in which a heating efficiency can be uniform in the step of heating the substrate 10 described later, can be selected as a good product.

It may be determined whether the absorption coefficient of the substrate 10 at the wavelength of 2 µm is 1.2 cm$^{-1}$ or more and 24 cm$^{-1}$ or less, and whether the difference between the maximum value and the minimum value of the absorption coefficient at the wavelength of 2 µm in the main surface of the substrate 10 is within 0.5 cm$^{-1}$. Among the plurality of the substrates 10, the substrate 10 satisfying the above requirements for the absorption coefficient in the infrared region is selected as a best product.

As described above, as shown in FIG. 1, the substrate 10 of the present embodiment is obtained.

Hereinafter, a semiconductor laminate 1 and a semiconductor device 2 are manufactured, using the substrate 10 selected as the good product (or the best product). In the following steps, a step of irradiating at least the substrate 10 with infrared rays to heat the substrate 10, is performed as at least one step. In the present embodiment, examples of the step of heating the substrate 10 include a semiconductor layer forming step S120, an activation annealing step S130, a protective film forming step S143, an ohmic alloy step S146, and the like.

(S120: Semiconductor Layer Forming Step)

Next, at least infrared rays are irradiated to the substrate 10, to epitaxially grow a semiconductor layer 20 on the substrate 10, by Metal Organic Vapor Phase Epitaxy (MOVPE), for example.

At this time, since the substrate 10 satisfies the above requirements for the absorption coefficient in the infrared region, the substrate can be stably heated by the irradiation of the substrate 10 with infrared rays, and the temperature of the substrate 10 can be accurately controlled. Further, the heating efficiency by the irradiation with infrared rays can be uniform in the main surface of the substrate 10. As a result, crystallinity, a thickness, various impurity concentrations and the like in the semiconductor layer 20 can be accurately controlled and can be uniform in the main surface of the substrate 10.

Specifically, the semiconductor layer 20 of the present embodiment is formed by the following procedure, for example.

First, the substrate 10 is loaded into a processing chamber of a MOVPE apparatus (not shown).

At this time, as shown in FIGS. 9A and 9B, the substrate 10 is placed on a holding member 300. The holding member 300 has, for example, three convex parts 300p, and is configured to hold the substrate 10 by three convex parts 300p. Therefore, when the substrate 10 is heated, the substrate 10 can be heated mainly by irradiating the substrate 10 with infrared rays rather than transferring heat from the holding member 300 to the substrate 10. Here, in a case that the heating of the substrate 10 is performed by transferring heat from the plate-like holding member (or in the case of performing by combining the heat transfer), it is difficult to uniformly heat the substrate 10 over the entire area of the surface thereof, depending on the back surface state of the substrate 10 and the surface state of the holding member. A warp of the substrate may occur due to the heating of the substrate 10, and the contact degree between the substrate 10 and the holding member may gradually change. For this reason, the heating condition of the substrate 10 may become uneven over the entire area of the surface thereof. In contrast, in the present embodiment, the heating of the substrate 10 is performed mainly by irradiating the substrate 10 with infrared rays using the above holding member 300. Therefore, such problems can be solved, and the substrate 10 can be heated stably and uniformly in the main surface.

In order to decrease the influence of the heat transfer, it is preferable to select a shape and a dimension of the convex part 300p properly, so that a contact area between the convex part 300p and the substrate 10 is 5% or less, preferably 3% or less, relative to a supported surface of the substrate 10.

After the substrate 10 is placed on the holding member 300, hydrogen gas and NH$_3$ gas (and further N$_2$ gas) are supplied into the processing chamber of the MOVPE apparatus, and infrared rays are irradiated to the substrate 10 from a predetermined heating source (for example, a lamp heater), to heat the substrate 10. After a temperature of the substrate 10 becomes a predetermined temperature (for example, 1000° C. or more and 1100° C. or less), for example, trimethylgallium (TMG) as a group-III organic metal material and NH₃ gas as a group-V material are supplied to the substrate 10. At the same time, for example, SiH₄ gas as a n-type impurity material is supplied to the substrate 10. Therefore, an underlying n-type semiconductor layer 21 as an n-type GaN layer is epitaxially grown on the substrate 10.

Next, a drift layer 22 as an n-type GaN layer containing n-type impurities in a lower concentration than that of the underlying n-type semiconductor layer 21, is epitaxially grown on the underlying n-type semiconductor layer 21.

Next, a first p-type semiconductor layer 23 as a p-type GaN layer is epitaxially grown on the drift layer 22. At this time, for example, Bis(cyclopentadienyl)magnesium (Cp₂Mg) as a p-type impurity material instead of the n-type impurity material, is supplied to the substrate 10.

Next, a second p-type semiconductor layer 24 as a p-type GaN layer containing p-type impurities in a higher concentration than that of the first p-type semiconductor layer 23, is epitaxially grown on the first p-type semiconductor layer 23.

After the growth of the second p-type semiconductor layer 24 is finished, the supply of the group-III organic metal material and the heating of the substrate 10 are stopped. After the temperature of the substrate 10 becomes 500° C. or less, the supply of the group-V material is stopped. Thereafter, an atmosphere in the processing chamber of the MOVPE apparatus is replaced with N₂ gas, to return its pressure to the atmospheric pressure. And, the temperature inside of the processing chamber is lowered to a temperature at which the substrate can be unloaded, and thereafter the substrate 10 after growth is unloaded from the processing chamber.

Therefore, as shown in FIG. 6, a semiconductor laminate 1 of the present embodiment is manufactured.

(S130: Activation Annealing Step)

Next, for example, at least infrared rays are irradiated to the substrate 10 under an atmosphere of inert gas by a predetermined heat treatment apparatus (not shown), to anneal a semiconductor laminate 1. Therefore, a hydrogen bonded to the p-type impurity is eliminated (removed) from each of the first p-type semiconductor layer 23 and the second p-type semiconductor layer 24, and the p-type impurities in each of the first p-type semiconductor layer 23 and the second p-type semiconductor layer 24 are (electrically) activated.

At this time, at least the drift layer 22 in the semiconductor layer 20 has a low free electron concentration and a low absorption coefficient in an infrared region, and therefore is not easily heated. In contrast, in the present embodiment, at least the substrate 10 is heated by the irradiation with infrared rays from the predetermined heating source (for example, a lamp heater), to heat the first p-type semiconductor layer 23 and the second p-type semiconductor layer 24.

At this time, since the substrate 10 satisfies the above requirements for the absorption coefficient in the infrared region, the substrate 10 can be stably heated by the irradiation of the substrate 10 with infrared rays, and the temperature of the substrate 10 can be accurately controlled. Further, the heating efficiency by the irradiation with infrared rays can be uniform in the main surface of the substrate 10. As a result, activation degree (an activation rate, a free hole concentration) of the p-type impurities in each of the first p-type semiconductor layer 23 and the second p-type semiconductor layer 24 can be accurately controlled and can be uniform in the main surface of the substrate 10.

At this time, as shown in FIGS. 9A and 9B, the substrate 10 is heated, using the holding member 300. Therefore, the substrate 10 can be heated mainly by irradiating the substrate 10 with infrared rays rather than transferring heat from the holding member 300 to the substrate 10. As a result, the substrate 10 can be heated stably and uniformly in the main surface.

At this time, the inert gas atmosphere is an atmosphere containing N₂ gas, or noble gas such as argon (Ar) gas and the like, for example. The temperature of the substrate 10 (the semiconductor laminate 1) is set to, for example, 500° C. or more and 700° C. or less, and an annealing time is set to, for example, 3 minutes or more and 30 minutes or less.

(S140: Semiconductor Device Manufacturing Step)

Next, a semiconductor device manufacturing step S140 of manufacturing a semiconductor device 2 using the above semiconductor laminate 1, is performed. The semiconductor device manufacturing step S140 of the present embodiment includes, for example, a mesa forming step S141, a first p-type electrode forming step S142, a protective film forming step S143, a second p-type electrode forming step S144, an n-type electrode forming step S145, and an ohmic alloy step S146.

(S141: Mesa Forming Step)

Next, a part of the second p-type semiconductor layer 24, the first p-type semiconductor layer 23, and the drift layer 22 is etched by, for example, RIE (Reactive Ion Etching), in a state where a predetermined resist pattern (not shown) is formed on the second p-type semiconductor layer 24.

Therefore, as shown in FIG. 10A, a mesa structure 29 is formed in the second p-type semiconductor layer 24, the first p-type semiconductor layer 23, and the drift layer 22. Thereafter, the resist pattern is removed.

(S142: First p-Type Electrode Forming Step)

Next, a palladium (Pd)/nickel (Ni) film is formed by, for example, sputtering method so as to cover the surfaces of the mesa structure 29 and the drift layer 22, and the Pd/Ni film is patterned in a predetermined shape by photolithography.

Therefore, as shown in FIG. 10B, a first p-type electrode (a first anode) 320 is formed on a top surface of the mesa structure 29, that is, on the second p-type semiconductor layer 24.

(S143: Protective Film Forming Step)

Next, a SOG (Spin On Glass) film is formed by, for example, spin-coating method so as to cover the surfaces of the mesa structure 29 and the drift layer 22. At this time, a thickness of the SOG film is set to, for example, 100 nm or more and 500 nm or less.

Next, for example, at least infrared rays are irradiated to the substrate 10 under an atmosphere of inert gas such as N₂ gas and the like by a predetermined heat treatment apparatus (not shown), to anneal a semiconductor laminate 1. Thereby, organic solvent components are volatized from the SOG film, and the SOG film is cured.

At this time, an absorption coefficient of the SOG film in an infrared region is low, and therefore the SOG film itself is not easily heated by the irradiation with infrared rays. In contrast, in the present embodiment, at least the substrate 10 is heated by the irradiation with infrared rays from the predetermined heating source (for example, a lamp heater), to heat the SOG film.

At this time, since the substrate 10 satisfies the above requirements for the absorption coefficient in the infrared region, the substrate can be stably heated by the irradiation of the substrate 10 with infrared rays, and a temperature of the substrate 10 can be accurately controlled. Further, the heating efficiency by irradiating with infrared rays can be uniform in the main surface of the substrate 10. As a result, a film quality of the SOG film (a volatilization degree of the solvent from the SOG film, a curing degree and the like) can be accurately controlled and can be uniform in the main surface of the substrate 10.

At this time, as shown in FIGS. 9A and 9B, the substrate 10 is heated, using the holding member 300. Therefore, the substrate 10 can be heated mainly by irradiating the substrate 10 with infrared rays rather than transferring heat from the holding member 300 to the substrate 10. As a result, the substrate 10 can be heated stably and uniformly in the main surface.

At this time, the inert gas atmosphere is an atmosphere containing $N_2$ gas, or noble gas such as Ar gas and the like, for example. The temperature of the substrate 10 (the semiconductor laminate 1) is set to, for example, 200° C. or more and 500° C. or less, and an annealing time is set to, for example, 30 minutes or more and 3 hours or less.

After the SOG film is formed, a silicon oxide film (a $SiO_2$ film) is formed on the SOG film by sputtering method, for example. A thickness of the $SiO_2$ film is set to, for example, 100 nm or more and 500 nm or less. After the $SiO_2$ film is formed on the SOG film, these oxide films are patterned in a predetermined shape by photolithography.

Therefore, as shown in FIG. 11A, a protective film 40 is formed so as to cover a surface of the drift layer 22 outside the mesa structure 29, a side surface of the mesa structure 29, and a part of a surface of the second p-type semiconductor layer 24 (a periphery of a top surface of the mesa structure 29).

(S144: Second p-Type Electrode Forming Step)

Next, a Ti/Al film is formed by, for example, sputtering method, so as to cover the first p-type electrode 32 inside an opening of the protective film 40 and the protective film 40. The Ti/Al film is patterned in a predetermined shape by photolithography.

Therefore, as shown in FIG. 11B, a second p-type electrode (a p-type electrode pad) 34 is formed so as to contact with the first p-type electrode 32 inside the opening of the protective film 40, and cover the mesa structure 29 by extending on the protective film 40 outside the first p-type electrode 32. Specifically, the second p-type electrode 34 is formed so as to overlap a part of the surface of the drift layer 22 outside the mesa structure 29, the side surface of the mesa structure 29, and the top surface of the mesa structure 29, when the semiconductor laminate 1 is viewed from above in a plan view. Therefore, the electric field can be suppressed from concentrating in an edge of the first p-type electrode 32 and a vicinity of an interface of p-n junction near the side surface of the mesa structure 29.

(S145: N-Type Electrode Forming Step)

Next, a Ti/Al film is formed on a back surface of the substrate 10 by, for example, sputtering method, and the Ti/Al film is patterned in a predetermined shape by photolithography. Therefore, an n-type electrode 36 is formed on the back side of the substrate 10.

(S146: Ohmic Alloy Step)

Next, for example, at least infrared rays are irradiated to the semiconductor laminate 1 under an atmosphere of inert gas by a predetermined heat treatment apparatus (not shown), to anneal a semiconductor laminate 1. Therefore, while an adhesion of each metal film constituting the first p-type electrode 32, the second p-type electrode 34 and n-type electrode 36 is improved, a contact resistance between the first p-type electrode 32 and the second p-type semiconductor layer 24, a contact resistance between the second p-type electrode 34 and the first p-type electrode 32, and a contact resistance between the n-type electrode 36 and the substrate 10 are decreased.

At this time, the first p-type electrode 32, the second p-type electrode 34 and the n-type electrode 36 are directly heated by the irradiation with infrared rays from a predetermined heating source (for example, a lamp heater). Further, the substrate 10 is heated by the irradiation with infrared rays, to heat the first p-type electrode 32, the second p-type electrode 34 and the n-type electrode 36.

At this time, since the substrate 10 satisfies the above requirements for the absorption coefficient in the infrared region, the substrate 10 can be stably heated by the irradiation of the substrate 10 with infrared rays, and the temperature of the substrate 10 can be accurately controlled. Further, the heating efficiency by the irradiation with infrared rays can be uniform in the main surface of the substrate 10. As a result, the contact resistance between the first p-type electrode 32 and the second p-type semiconductor layer 24, the contact resistance between the second p-type electrode 34 and the first p-type electrode 32, and the contact resistance between the n-type electrode 36 and the substrate 10 can be uniform in the main surface of the substrate 10.

At this time, as shown in FIGS. 9A and 9B, the substrate 10 is heated, using the holding member 300. Therefore, the substrate 10 can be heated mainly by irradiating the substrate 10 with infrared rays rather than transferring heat from the holding member 300 to the substrate 10. As a result, the substrate 10 can be heated stably and uniformly in the main surface.

At this time, the inert gas atmosphere is an atmosphere containing $N_2$ gas, or noble gas such as Ar gas and the like, for example. The temperature of the substrate 10 (the semiconductor laminate 1) is set to, for example, 500° C. or more and 700° C. or less, and an annealing time is set to, for example, 30 minutes or more and 3 hours or less.

Thereafter, the semiconductor laminate 1 is diced and chips having a predetermined size are cut out.

As described above, as shown in FIG. 12, a semiconductor device 2 of the present embodiment is manufactured.

(4) Effect Obtained by the Present Embodiment

According to the present embodiment, one or more of the following effects can be obtained.

(a) The substrate 10 manufactured by the manufacturing method of the present embodiment is in a state where the small crystal strain is small and almost no impurities other than O and n-type impurities (for example, impurities that compensate for the n-type impurities) are contained. Thereby, in the substrate 10 of the present embodiment, the absorption coefficient α in the wavelength range of at least 1 μm or more and 3.3 μm or less can be approximately expressed by the above equation (1) ($\alpha = n\, K\, \lambda^a$) using the predetermined constant K and constant a. As a result, heating conditions in the step of heating the substrate 10 by irradiating the substrate 10 with at least infrared rays can be easily set, and the substrate 10 can be heated with high accuracy and good reproducibility.

For your reference, in the GaN crystal manufactured by a conventional manufacturing method, it is difficult to approximately express the absorption coefficient α by the above equation (1) with high accuracy using the above-defined constant K and constant a.

Figure 5B:
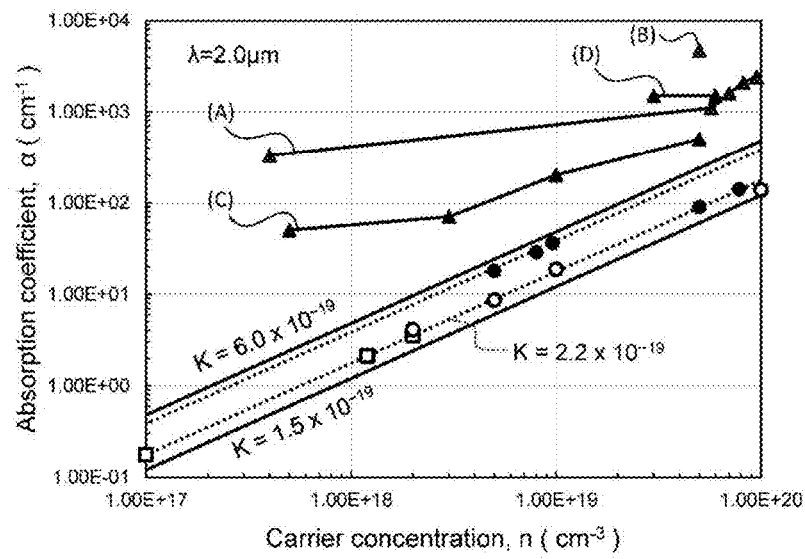
FIG. 5B is a view comparing the relationship between the free electron concentration and the absorption coefficient at a wavelength of 2 μm.

Here, FIG. 5B is a view for comparing the relationship of the absorption coefficient at a wavelength of 2 μm with respect to the free electron concentration. FIG. 5B shows not only the absorption coefficient of the GaN crystal manufactured by the manufacturing method of the present embodiment, but also the absorption coefficient of the GaN crystal described in the papers (A) to (D).

Paper (A): A. S. Barker Physical Review B 7 (1973) p 743 FIG. 8

Paper (B): Perlin, Physicsl Review Letter 75 (1995) p 296 FIG. 1 Estimated from 0.3 GPa curve.

Paper (C): G. Bentoumi, Material Science Engineering B50 (1997) p 142-147, FIG. 1

Paper (D): S. M. Porowski, J. A. Crystal Growth 189-190 (1998) p. 153-158 FIG. 3 However, T=12K As shown in FIG. 5B, the absorption coefficient $\alpha$ in the conventional GaN crystal described in the papers (A) to (D) was larger than the absorption coefficient $\alpha$ of the GaN crystal manufactured by the manufacturing method of the present embodiment. Further, the slope of the absorption coefficient $\alpha$ in the conventional GaN crystal was different from the slope of the absorption coefficient $\alpha$ of the GaN crystal manufactured by the manufacturing method of the present embodiment. In the papers (A) and (C), it was also seen that the slope of the absorption coefficient $\alpha$ changed as the free electron concentration n increased. Therefore, in the conventional GaN crystal described in the papers (A) to (D), it has been difficult to accurately approximately express the absorption coefficient $\alpha$ by the above equation (1) using the above defined constant K and constant a. Specifically, for example, there was a possibility that the constant K was higher than the above-described defined range, or the constant a was a value other than 3.

This is considered to be due to the following reasons.

It is considered that a large crystal strain occurred in the conventional GaN crystal due to the manufacturing method. When the crystal strain occurs in the GaN crystal, dislocations increase in the GaN crystal. Therefore, in the conventional GaN crystal, it is considered that dislocation scattering occurred and the absorption coefficient $\alpha$ increased or varied due to the dislocation scattering.

Or, in the GaN crystal manufactured by the conventional manufacturing method, it is considered that the concentration of O mixed unintentionally was high. When O is mixed at a high concentration in the GaN crystal, the lattice constants a and c of the GaN crystal increase (Reference: Chris G. Van de Walle, Physical Review B vol. 68, 165209 (2003)). Therefore, in the conventional GaN crystal, it is considered that a local lattice mismatch occurs between a portion contaminated by O and a relatively pure portion, and the crystal strain occurred in the GaN crystal. As a result, in the conventional GaN crystal, it is considered that the absorption coefficient $\alpha$ increased or varied.

Or, in the GaN crystal manufactured by the conventional manufacturing method, it is considered that the compensation impurity for compensating the n-type impurity was mixed unintentionally and the concentration of the compensation impurity was high. If the concentration of the compensation impurity is high, a high concentration of n-type impurities is required in order to obtain a predetermined free electron concentration. Therefore, in the conventional GaN crystal, it is considered that a total impurity concentration including the compensation impurity and the n-type impurity was increased, and the crystal strain was increased. As a result, in the conventional GaN crystal, it is considered that the absorption coefficient $\alpha$ increased or varied.

In a GaN free-standing substrate actually containing O and having a lattice strain, it has been confirmed that the absorption coefficient $\alpha$ is high (and the mobility is low) compared to the substrate 10 of the present embodiment having the same free electron concentration.

For these reasons, in the conventional GaN crystal, it has been difficult to accurately approximately express the absorption coefficient $\alpha$ by the above equation (1) using the above defined constant K and constant a. Namely, in the conventional GaN crystal, it was difficult to design the absorption coefficient with high accuracy based on the free electron concentration n. Therefore, in the substrate including the conventional GaN crystal, heating efficiency easily varied depending on the substrate, and it has been difficult to control a substrate temperature in the step of heating the substrate by irradiating the substrate with at least infrared rays. As a result, there was a possibility that the temperature reproducibility for each substrate would be low.

In contrast, the substrate 10 manufactured by the manufacturing method of the present embodiment is in a state where the crystal strain is small and almost no impurities other than O and n-type impurities are contained. The absorption coefficient of the substrate 10 of the present embodiment is less affected by scattering due to crystal strain (dislocation scattering) and mainly depends on ionized impurity scattering. Thereby, variation of the absorption coefficient $\alpha$ of the substrate 10 can be reduced, and the absorption coefficient $\alpha$ of the substrate 10 can be approximately expressed by the above equation (1) using the predetermined constant K and constant a. Since the absorption coefficient $\alpha$ of the substrate 10 can be approximately expressed by the above equation (1), the absorption coefficient of the substrate 10 can be designed with high accuracy based on the concentration n of the free electrons generated in the substrate 10 by doping with the n-type impurities. Since the absorption coefficient of the substrate 10 can be designed with high accuracy based on the free electron concentration n, the heating condition can be easily set, and the temperature of the substrate 10 can be controlled with high accuracy in the step of heating the substrate 10 by irradiating the substrate 10 with at least infrared rays. As a result, the temperature reproducibility for each substrate 10 can be improved. Thus, in the present embodiment, it becomes possible to heat the substrate 10 with high accuracy and good reproducibility.

(b) In the present embodiment, since the semiconductor layer 30 is grown on the substrate 10 having a small crystal strain, a crystal strain in the semiconductor layer 30 can be reduced, and crystallinity of the semiconductor layer 30 can be improved. Further, since the temperature of the substrate 10 is controlled with high accuracy, crystallinity, a thickness, various impurity concentrations and the like of the semiconductor layer 20 grown on the substrate 10 can be controlled with high accuracy. Therefore, the semiconductor layer 20 can be manufactured with high quality, and a property for each semiconductor device 2 can be uniform.

For example, when the semiconductor device 2 is a light emitting device such as a light emitting diode, a laser diode, and the like, the light emitting efficiency of the semiconductor device 2 as the light emitting device can be improved by reducing a crystal strain of a light emitting layer. Since the incorporating amount of indium (In) depends on a growth temperature of the light emitting layer, composition ratio of In in the light emitting layer can be controlled with high accuracy, by controlling the temperature of the substrate 10 with high accuracy. Therefore, the emitting light wavelength for each semiconductor device 2 as the light emitting device can be uniform.

(c) The absorption coefficient due to free carrier absorption in the substrate 10 manufactured by the manufacturing method of the present embodiment is smaller than that of the conventional substrate. For this reason, the resistivity of the substrate 10 of the present embodiment is lower than that of the conventional substrate.

Here, for your reference, as shown in FIG. 5B, in the conventional GaN crystal, since the absorption coefficient due to free carrier absorption in the predetermined free electron concentration was large, it is considered that a mobility ($\mu$) was low. For this reason, it is considered that a resistivity ($\rho=1/en\mu$) was high in the conventional GaN crystal. As a result, it is considered that the on-resistance was high in a semiconductor device used a substrate including the conventional GaN crystal.

In order to obtain a desired resistivity in the conventional GaN crystal, it is conceivable to increase the concentration of n-type impurities. However, as the concentration of n-type impurities increases, the mobility tends to decrease. In order to obtain the desired resistivity in the conventional GaN crystal, it was necessary to excessively increase the concentration of n-type impurities. For this reason, the crystal strain was likely to be large in the conventional GaN crystal. As a result, the absorption coefficient $\alpha$ was likely to increase or to vary in the conventional GaN crystal.

In contrast, since the absorption coefficient due to free carrier absorption in the substrate 10 manufactured by the manufacturing method of the present embodiment is smaller than that of the conventional substrate, it is estimated that a mobility in the substrate 10 of the present embodiment is higher than that of the conventional substrate. Therefore, even when the free electron concentration in the substrate 10 of the present embodiment is equal to that of the conventional substrate, the resistivity of the substrate 10 of the present embodiment is lower than that of the conventional substrate. As a result, the on-resistance can decrease in the semiconductor device 2 used the substrate 10 of the present embodiment.

The concentration of n-type impurities for obtaining the desired resistivity in the substrate 10 of the present embodiment can be lower than that of the conventional substrate. Therefore, the crystal strain can be small, and the crystallinity of the substrate 10 can be improved. As a result, the desired resistivity of the substrate 10 can be obtained, while reducing variation of the absorption coefficient $\alpha$ of the substrate 10.

(d) Since the absorption coefficient $\alpha$ of the substrate 10 of the present embodiment satisfies $0.15\lambda^3 \leq \alpha$, the substrate 10 can sufficiently absorb infrared rays, and the substrate 10 can be stably heated. By setting $\Delta\alpha \leq 1.0$, heating efficiency by the irradiation with infrared rays can be made uniform in the main surface of the substrate 10 in the step of heating the substrate 10. Therefore, the quality of the semiconductor laminate 1 manufactured using the substrate 10 can be made uniform in the main surface of the substrate 10. As a result, the quality and yield of the semiconductor device 2 manufactured using the semiconductor laminate 1 can be improved.

(e) The concentration of intrinsic carriers thermally excited between the bands of the substrate 10 under the temperature condition of 27° C. or more and 1250° C. or less, is lower than the concentration of free electrons generated in the substrate 10 by doping with the n-type impurities under the temperature condition of 27° C. By satisfying the condition, it can be considered that the concentration of free carriers of the substrate 10 under the predetermined temperature condition in the step of heating the substrate 10 is approximately equal to the concentration of free carriers of the substrate 10 under the temperature condition of room temperature. Therefore, it can be considered that the free carrier absorption under a predetermined temperature condition is approximately equal to the free carrier absorption at room temperature. Namely, as described above, when the absorption coefficient of the substrate 10 in the infrared region satisfies the predetermined requirements at room temperature, it can be considered that the absorption coefficient of the substrate 10 in the infrared region substantially maintains the predetermined requirements described above under the predetermined temperature condition as well.

(f) The concentration of free electrons generated in the substrate 10 by doping with the n-type impurities is $1 \times 10^{18}$ cm$^{-3}$ or more under the temperature condition of 27° C., and the difference between the maximum value and the minimum value of the free electron concentration in the main surface of the substrate 10 is within $8.3 \times 10^{17}$ cm$^{-3}$. Therefore, the absorption coefficient at the wavelength of 2 μm in the substrate 10 can be 1.2 cm$^{-1}$ or more, and the difference between the maximum value and the minimum value of the absorption coefficient at the wavelength of 2 μm can be within 1.0 cm$^{-1}$.

(g) The concentration of O in the substrate 10 is 1/10 or less relative to the total concentration of Si and Ge in the substrate 10. Therefore, the concentration of n-type impurities in the substrate 10 can be controlled by the total concentration of Si and Ge, whose control of an amount of addition is relatively easy. Since the concentration of n-type impurities in the substrate 10 can be easily controlled, the free electron concentration n in the substrate 10 can be controlled accurately so as to satisfy predetermined requirements, and the difference $\Delta n$ between the maximum value and the minimum value of the concentration of free electrons in the main surface of the substrate 10 can be controlled accurately so as to satisfy predetermined requirements. As a result, the absorption coefficient of the substrate 10 can be adjusted with high accuracy and good reproducibility, and the absorption coefficient in the main surface of the substrate 10 can be stably uniformized.

Second Embodiment of the Present Invention

In the above-described embodiment, explanation is given for a case in which the semiconductor laminate 1 is configured to manufacture the semiconductor device 2 as the p-n junction diode. However, as in the second embodiment shown below, a semiconductor laminate 1 may be configured to manufacture other devices. In the present embodiment, only elements different from the above-described embodiment will be described.

(1) Semiconductor Laminate

Figure 13A:
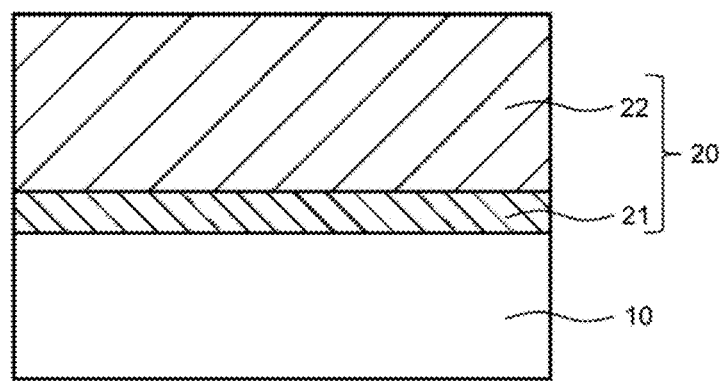
FIG. 13A is a schematic cross-sectional view showing a semiconductor laminate 1 according to a second embodiment of the present invention.

With reference to FIG. 13A, a semiconductor laminate 1 according to the present embodiment will be described. FIG. 13A is a schematic cross-sectional view showing a semiconductor laminate 1 according to the present embodiment.

As shown in FIG. 13A, the semiconductor laminate 1 of the present embodiment is configured as an intermediate used when manufacturing a semiconductor device 2 as a Schottky barrier diode (SBD). The semiconductor laminate 1 includes, for example, a substrate 10 and a semiconductor layer 20. The semiconductor layer 20 includes, for example, an underlying n-type semiconductor layer 21 and a drift layer 22, and meanwhile does not include a p-type semiconductor layer. The substrate 10, the underlying n-type semiconductor layer 21, and the drift layer 22 in the present embodiment are the same as the substrate 10, the underlying n-type semiconductor layer 21, and the drift layer 22 in the first embodiment, respectively. However, the drift layer 22 has a p-type impurity implanted portion (sign and numeral are not shown).

(2) Method for Manufacturing a Semiconductor Laminate and Method for Manufacturing a Semiconductor Device Next, with reference to FIG. 13 to FIG. 15, a method for manufacturing a semiconductor laminate 1 and a method for manufacturing a semiconductor device 2 according to the present embodiment will be described. FIG. 13B, FIG. 14A, FIG. 14B, and FIG. 15A are schematic cross-sectional views showing manufacturing steps of a semiconductor device, and FIG. 15B is a schematic cross-sectional view showing a semiconductor device 2 according to the present embodiment.

(S210 to S220: Substrate Preparing Step and Semiconductor Layer Forming Step)

As shown in FIG. 13A, a semiconductor laminate 1 is manufactured in the same way as the substrate preparing step S110 to the semiconductor layer forming step S120 in the first embodiment except for not forming the p-type semiconductor layer.

(S240: Semiconductor Device Manufacturing Step)

Next, a semiconductor device manufacturing step S240 of manufacturing a semiconductor device 2 using the above semiconductor laminate 1 is performed. The semiconductor device manufacturing step S240 includes, for example, an ion-implanting step S241, an activation annealing step S242, an n-type electrode forming step S245, and an ohmic alloy step S246.

(S241: Ion-Implanting Step)

Figure 13B:
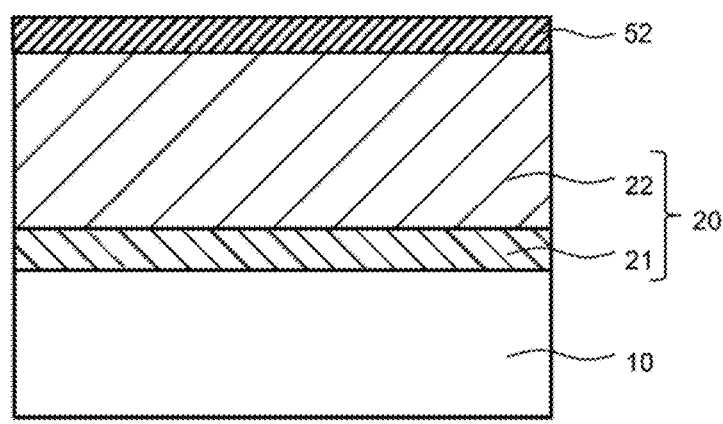
FIG. 13B is a schematic cross-sectional view showing a manufacturing step of a semiconductor device.

First, as shown in FIG. 13B, a surface side cap layer including a silicon nitride film (a SiNx film) or an aluminum nitride film (an AlN film) is formed on the semiconductor layer 20 by sputtering method, for example. Therefore, a damage to the drift layer 22 can be suppressed when ion-implanting to the drift layer 22, and a nitrogen (N) elimination from the drift layer 22 can be suppressed in the activation annealing step S242 described later. At this time, a thickness of the surface side cap layer 52 is set to 20 nm or more and 50 nm or less, for example.

Figure 14A:
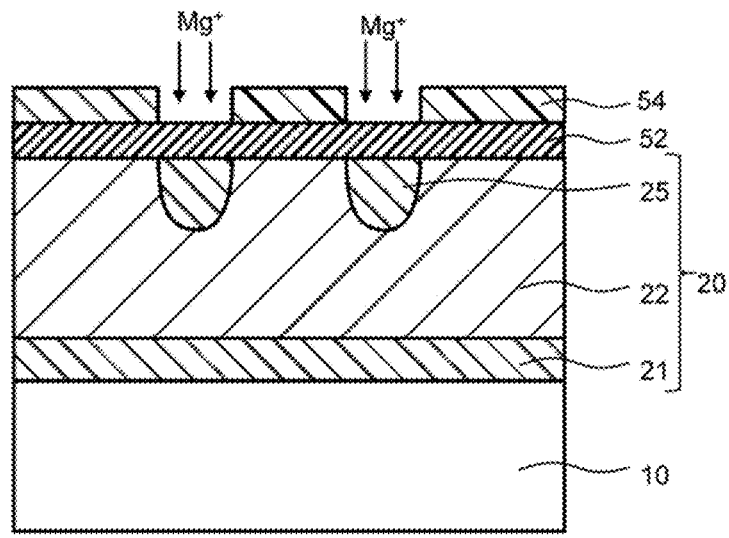
FIGS. 14A and 14B are schematic cross-sectional views showing a manufacturing step of a semiconductor device.

After the surface side cap layer 52 is formed, as shown in FIG. 14A, a predetermined resist pattern 54 is formed on the surface side cap layer 52. At this time, an opening (sign and numeral are not shown) is formed at a position of the impurity implanted portion of the drift layer 22 in a plan view, in the resist pattern 54. In the present embodiment, the opening of the resist pattern 54 is formed in a ring shape in a plan view, for example.

After the resist pattern 54 is formed, p-type impurities are ion-implanted into the impurity implanted portion of the drift layer 22 through the opening of the resist pattern 54. Therefore, a p-type region 25 containing p-type impurities is formed in the drift layer 22 (for example, in a part of a surface side region of the drift layer 22). The p-type region 25 is formed in a ring shape in a plan view, for example.

At this time, the p-type impurity to be ion-implanted is, for example, at least any one selected from the group consisting of Mn, C, iron (Fe), beryllium (Be), zinc (Zn), vanadium (V), and antimony (Sb). At this time, when ion-implanting p-type impurities, an acceleration voltage is set to, for example, 10 keV or more and 100 keV or less, and a dose amount is set to, for example, $1 \times 10^{13}$ cm$^{-2}$ or more and $1 \times 10^{15}$ cm$^{-2}$ or less. Thereby, for example, a maximum value of p-type impurity concentration in the p-type region 25 is, for example, $1.0 \times 10^{18}$ at·cm$^{-3}$ or more and $1.0 \times 10^{20}$ at·cm$^{-3}$ or less, and a depth of the p-type region 25 from the surface of the drift layer 22 is, for example, 50 nm or more and 300 nm or less.

After p-type impurities is ion-implanted, the resist pattern 54 is removed.

(S242: Activation Annealing Step)

Figure 14B:
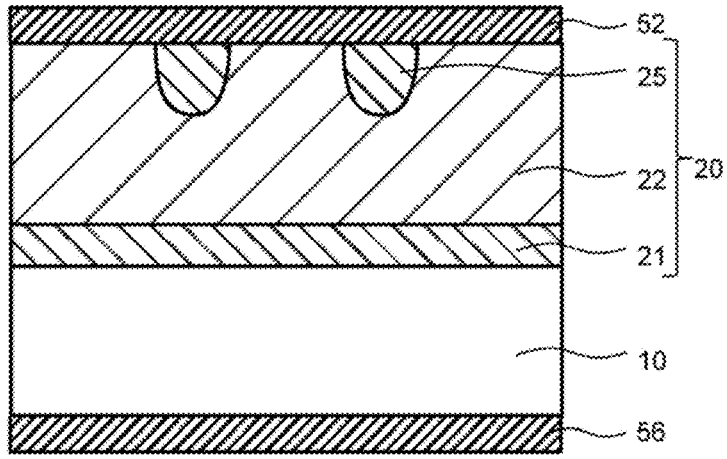

Next, as shown in FIG. 14B, a back surface side cap layer 56 including SiNx film or AlN film is formed on a back surface side of the substrate 10 by sputtering method, for example. Therefore, a nitrogen (N) elimination from the substrate 10 can be suppressed in the activation annealing step S242. At this time, a thickness of the back surface side cap layer 56 is set to, for example, 20 nm or more and 50 nm or less.

After the back surface side cap layer 56 is formed, for example, at least infrared rays are irradiated to the substrate 10 under an atmosphere of inert gas by a predetermined heat treatment apparatus (not shown), to anneal a semiconductor laminate 1. Therefore, a crystal damage which the semiconductor layer 20 suffers in the ion-implanting step S241 can be restored, and p-type impurities in the p-type region 25 are incorporated into the crystal lattices, to be activated (electrically).

At this time, at least the drift layer 22 in the semiconductor layer 20 has a low free electron concentration and a low absorption coefficient in an infrared region, and therefore is not easily heated. In contrast, in the present embodiment, at least the substrate 10 is heated by the irradiation with infrared rays from the predetermined heating source (for example, a lamp heater), to heat a semiconductor layer 20.

At this time, since the substrate 10 satisfies the above requirements for the absorption coefficient in the infrared region, the substrate 10 can be stably heated by the irradiation of the substrate 10 with infrared rays, and the temperature of the substrate 10 can be accurately controlled. Further, the heating efficiency by the irradiation with infrared rays can be uniform in the main surface of the substrate 10. As a result, activation degree (an activation rate, a free hole concentration) of the p-type impurities in the p-type region 25 can be stably controlled and can be uniform in the main surface of the substrate 10.

At this time, as shown in FIGS. 9A and 9B, the substrate 10 is heated, using the holding member 300. Therefore, the substrate 10 can be heated mainly by irradiating the substrate 10 with infrared rays rather than transferring heat from the holding member 300 to the substrate 10. As a result, the substrate 10 can be heated stably and uniformly in the main surface.

At this time, the annealing treatment is performed by the following processing procedure and processing conditions. For example, an increasing of temperature from a starting temperature to an annealing temperature is performed for a time within a range of 3 to 30 seconds. A holding at the annealing temperature is performed for a time within a range of 20 seconds to 3 minutes. Thereafter, a decreasing of temperature from the annealing temperature to a stopping temperature is performed for a time within a range of 1 to 10 minutes. The stopping temperature and the starting temperature are set to, for example, a temperature within a range of 500° C. or more and 800° C. or less, respectively. The annealing temperature is set to, for example, a temperature within a range of 1100° C. or more and 1250° C. or less. The inert gas atmosphere of the annealing treatment is an atmosphere containing $N_2$ gas, or noble gas such as argon (Ar)

gas and the like, for example. A pressure in its atmosphere is set to, for example, a pressure within a range of 100 to 250 kPa.

Figure 15A:
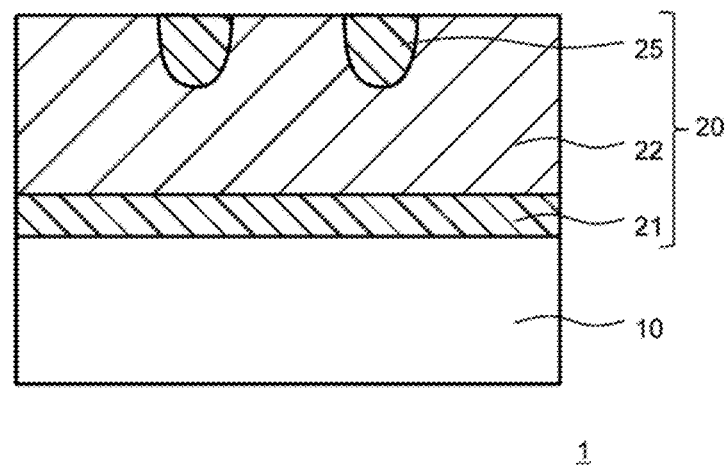
FIG. 15A is a schematic cross-sectional view showing a manufacturing step of a semiconductor device.
Figure 15B:
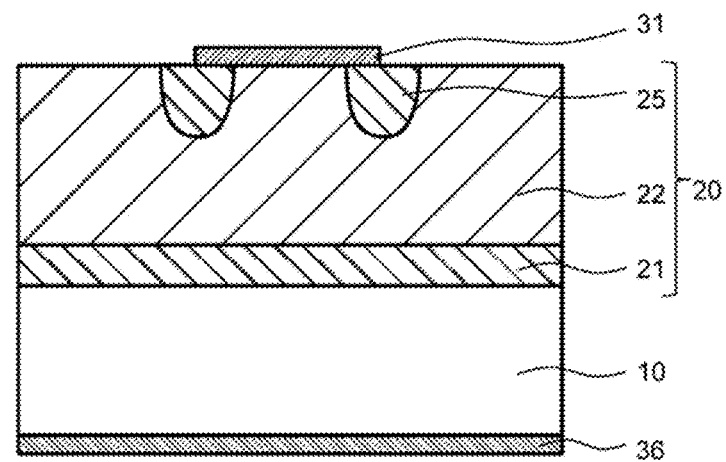
FIG. 15B is a schematic cross-sectional view showing a semiconductor device 2 according to the second embodiment of the present invention.

After the annealing treatment is finished, as shown in FIG. 15A, the surface side cap layer 52 and the back surface side cap layer 56 are removed by a predetermined solvent.

(S244: P-Type Electrode Forming Step)

Next, a Pd/Ni film is formed by, for example, sputtering method so as to cover the semiconductor layer 20, the Pd/Ni film is patterned in a predetermined shape by photolithography. Therefore, a p-type electrode 31 is formed so that an outer periphery of the p-type electrode 31 overlaps the p-type region 25 in a plan view.

(S245: N-Type Electrode Forming Step)

Next, a Ti/Al film is formed on a back surface of the substrate 10 by, for example, sputtering method, and the Ti/Al film is patterned in a predetermined shape by photolithography. Therefore, an n-type electrode 36 is formed on the back side of the substrate 10.

(S246: Ohmic Alloy Step)

Next, an ohmic alloy step S246 is performed in the same way as the ohmic alloy step S146 of the first embodiment.

Thereafter, the semiconductor laminate 1 is diced and chips having a predetermined size are cut out.

As described above, as shown in FIG. 15B, a semiconductor device 2 of the present embodiment is manufactured. Since the p-type region 25 as a guard ring is formed on the surface side of the drift layer 22 in the semiconductor device 2, the electric field can be suppressed from concentrating in the periphery of the p-type electrode 31. As a result, a breakdown voltage of the semiconductor device 2 can be improved.

(3) Effect Obtained by the Present Embodiment

In the present embodiment, in the activation annealing step S242 after ion-implanting, by heating the substrate 10 satisfying the above requirements for the absorption coefficient in the infrared region, the semiconductor layer 20 is heated, to activate p-type impurities in the p-type region 25.

Here, the activation annealing step after ion-implanting is often performed at a high temperature for a short time, in order to activate p-type impurities while suppressing crystal damage. For this reason, when it is difficult to design the absorption coefficient based on the free electron concentration n as in a substrate including the conventional GaN crystal, a heating efficiency may excessively vary depending on the substrate. As a result, the variation in activation degree of p-type impurities may occur for each substrate, or the variation in the crystal damage of the semiconductor layer (for example, the N elimination) may occur for each substrate. When the variation in the heating efficiency occurs in the main surface of the substrate, the variation in activation degree of p-type impurities may occur in the main surface of the substrate, or the crystal damage of the semiconductor layer may occur unevenly in the main surface of the substrate.

In contrast, in the present embodiment, since the substrate 10 satisfies the above requirements for the absorption coefficient in the infrared region, the temperature of the substrate 10 heated by the irradiation with infrared rays can be accurately controlled, and the reproducibility of the temperature for each substrate 10 can be improved. Therefore, the variation in activation degree of the p-type impurities can be suppressed for each substrate. The variation in the crystal damage of the semiconductor layer can be suppressed for each substrate, and the crystal damage itself of the semiconductor layer can be easily suppressed by forming the proper cap layer. Further, since the substrate 10 satisfies the above requirements for the absorption coefficient in the infrared region, the heating efficiency by the irradiation with infrared rays can be uniform in the main surface of the substrate 10. Therefore, activation degree of the p-type impurities can be uniform in the main surface of the substrate 10 (the semiconductor layer 20), and an occurrence of a local crystal damage can be suppressed in the semiconductor layer 20. As these results, the quality and yield of the semiconductor device 2 manufactured using the semiconductor laminate 1 can be improved.

OTHER EMBODIMENTS

The embodiments of the present invention have been specifically described above. However, the present invention is not limited to the above-described embodiment, and various modifications can be made without departing from the scope of the invention.

In the above-described embodiment, explanation has been given for a case where the substrate 10 and the semiconductor layer 20 includes GaN, respectively. However, the substrate 10 may also include not only GaN, but also group-III nitrides such as AlN, aluminum gallium nitride (AlGaN), indium nitride (InN), indium gallium nitride (InGaN), aluminum indium gallium nitride (AlInGaN), namely, group-III nitride represented by a composition formula of $Al_xIn_yGa_{1-x-y}N$ ($0 \leq x \leq 1$, $0 \leq y \leq 1$, $0 \leq x+y \leq 1$).

In the above-described embodiment, explanation has been given for a case where the semiconductor layer 20 includes group-III nitride semiconductor (GaN) similarly to the substrate 10. However, the semiconductor layer 20 may include group-III nitride semiconductor different from the substrate 10.

In the above-described embodiment, explanation has been given for a case where the substrate 10 is manufactured using the seed substrate 5 including GaN single crystal in the substrate manufacturing step S112. However, the substrate 10 may be manufactured by the following method. For example, a GaN layer provided on a heterogeneous substrate such as a sapphire substrate is used as an underlayer. Then, a crystal ingot on which the GaN layer is grown thickly through a nanomask or the like is peeled off from the heterogeneous substrate. Thereafter, a plurality of substrates 10 may be cut out from the crystal ingot.

In the above-described embodiment, explanation has been given for a case where the semiconductor layer 20 is formed by MOVPE method in the semiconductor layer forming step S120. However, the semiconductor layer 20 may be formed by other vapor phase epitaxy methods such as HVPE method, or liquid phase epitaxy methods such as flux method or ammono-thermal method.

In the above-described first embodiment, explanation has been given for a case where the semiconductor device 2 is the p-n junction diode, and in the above-described second embodiment, explanation has been given for a case where the semiconductor device 2 is the SBD. However, the semiconductor device 2 may be configured as another device, as long as the substrate 10 containing n-type impurities is used. The semiconductor device 2 may be configured as a light emitting diode, a laser diode, a junction barrier diode (JBS), a bipolar transistor, or the like, for example.

In the above-described second embodiment, explanation has been given for a case where p-type impurities are ion-implanted into the semiconductor layer 20 in the ion-implanting step S241. However, other impurities such as n-type impurities may be ion-implanted into the semiconductor layer 20 depending on necessary.

<Preferred Aspects of the Present Invention>

(Supplementary Description 1)

There is provided a nitride crystal substrate comprising group-III nitride crystal and containing n-type impurities, wherein an absorption coefficient α is approximately expressed by equation (1) in a wavelength range of at least 1 μm or more and 3.3 μm or less:

$$\alpha = nK\lambda^a \quad (1)$$

(wherein, $\lambda$(μm) is a wavelength, $\alpha$(cm$^{-1}$) is absorption coefficient of the nitride crystal substrate at 27° C., n (cm$^{-3}$) is a free electron concentration in the nitride crystal substrate, and K and a are constants, satisfying $1.5 \times 10^{-19} \leq K \leq 6.0 \times 10^{-19}$, a=3).

(Supplementary Description 2)

There is provided the nitride crystal substrate according to supplementary description 1, wherein the absorption coefficient α is approximately expressed by equation (1)" in a wavelength range of at least 1 μm or more and 3.3 μm or less:

$$\alpha = 2.2 \times 10^{-19} n\lambda^3 \quad (1)''$$

(Supplementary Description 3)

There is provided the nitride crystal substrate according to supplementary description 1 or 2, wherein the absorption coefficient α and Δα satisfy equations (2) and (3) in a wavelength range of at least 1 μm or more and 3.3 μm or less:

$$\alpha \geq 0.15 \lambda^3 \quad (2)$$

$$\Delta\alpha \leq 1.0 \quad (3)$$

wherein, Δα is a difference between a maximum value and a minimum value of the absorption coefficient α in a main surface of the nitride crystal substrate.

(Supplementary Description 4)

There is provided a nitride crystal substrate comprising group-III nitride crystal and containing n-type impurities, wherein an absorption coefficient of the nitride crystal substrate at a wavelength of 2 μm is 1.2 cm$^{-1}$ or more, and a difference between a maximum value and a minimum value of the absorption coefficient at a wavelength of 2 μm in a main surface of the nitride crystal substrate is within 1.0 cm$^{-1}$.

(Supplementary Description 5)

There is provided the nitride crystal substrate according to any one of the supplementary descriptions 1 to 4, wherein a concentration of intrinsic carriers thermally excited between bands of the nitride crystal substrate under a temperature condition of 27° C. or more and 1250° C. or less, is lower than a concentration of free electrons generated in the nitride crystal substrate by doping with the n-type impurities under a temperature condition of 27° C.

(Supplementary Description 6)

There is provided the nitride crystal substrate according to any one of the supplementary descriptions 1 to 5, wherein a concentration of free electrons generated in the nitride crystal substrate by doping with the n-type impurities, is $1 \times 10^{18}$ cm$^{-3}$ or more under a temperature condition of 27° C., and a difference between a maximum value and a minimum value of the free electron concentration in a main surface of the nitride crystal substrate is within $8.3 \times 10^{17}$ cm$^{-3}$.

(Supplementary Description 7)

There is provided the nitride crystal substrate according to any one of the supplementary descriptions 1 to 6, wherein a concentration of the n-type impurities in the nitride crystal substrate is $1 \times 10^{18}$ at·cm$^{-3}$ or more, and a difference between a maximum value and a minimum value of the concentration of the n-type impurities in a main surface of the nitride crystal substrate is within $8.3 \times 10^{17}$ at·cm$^{-3}$.

(Supplementary Description 8)

There is provided the nitride crystal substrate according to any one of the supplementary descriptions 1 to 7, wherein a concentration of oxygen in the nitride crystal substrate is 1/10 or less relative to a total concentration of silicon and germanium in the nitride crystal substrate.

(Supplementary Description 9)

There is provided the nitride crystal substrate according to the supplementary description 8, wherein the concentration of oxygen in the nitride crystal substrate is less than $1 \times 10^{17}$ at·cm$^{-3}$, and the total concentration of silicon and germanium in the nitride crystal substrate is $1 \times 10^{18}$ at·cm$^{-3}$ or more.

(Supplementary Description 10)

There is provided a semiconductor laminate, including:

a nitride crystal substrate comprising group-III nitride crystal and containing n-type impurities; and a semiconductor layer comprising group-III nitride semiconductor and provided on the nitride crystal substrate, wherein an absorption coefficient α is approximately expressed by equation (1) in a wavelength range of at least 1 μm or more and 3.3 μm or less:

$$\alpha = nK\lambda^a \quad (1)$$

(wherein, $\lambda$(μm) is a wavelength, $\alpha$(cm$^{-1}$) is absorption coefficient of the nitride crystal substrate at 27° C., n (cm$^{-3}$) is a free electron concentration in the nitride crystal substrate, and K and a are constants, satisfying $1.5 \times 10^{-19} \leq K \leq 6.0 \times 10^{-19}$, a=3).

(Supplementary Description 11)

There is provided a semiconductor laminate, including:

a nitride crystal substrate comprising group-III nitride crystal and containing n-type impurities; and a semiconductor layer comprising group-III nitride semiconductor and provided on the nitride crystal substrate, wherein an absorption coefficient of the nitride crystal substrate at a wavelength of 2 μm is 1.2 cm$^{-1}$ or more, and a difference between a maximum value and a minimum value of the absorption coefficient at a wavelength of 2 μm in a main surface of the nitride crystal substrate is within 1.0 cm$^{-1}$.

(Supplementary Description 12)

There is provided the semiconductor laminate according to the supplementary description 10 or 11, wherein a reflectance of a surface of the semiconductor layer is 5% or more and 30% or less in a wavelength range of at least 1 μm or more and 3.3 μm or less.

(Supplementary Description 13)

There is provided the semiconductor laminate according to any one of the supplementary descriptions 10 to 12, wherein the semiconductor layer includes a p-type semiconductor layer containing p-type impurities and provided on the nitride crystal substrate.

(Supplementary Description 14)
There is provided the semiconductor laminate according to any one of the supplementary descriptions 10 to 12, wherein the semiconductor layer has an impurity implanted portion.

(Supplementary Description 15)
There is provided a method for manufacturing a semiconductor laminate, including:
preparing a nitride crystal substrate comprising group-III nitride crystal and containing n-type impurities; and
irradiating the nitride crystal substrate with at least infrared rays, to heat the nitride crystal substrate,
wherein, in the preparation of the nitride crystal substrate, a substrate with an absorption coefficient α being approximately expressed by equation (1) in a wavelength range of at least 1 μm or more and 3.3 μm or less, is prepared as the nitride crystal substrate:

$$\alpha = nK\lambda^a \quad (1)$$

(wherein, λ(μm) is a wavelength,
α(cm$^{-1}$) is absorption coefficient of the nitride crystal substrate at 27° C.,
n (cm$^{-3}$) is a free electron concentration in the nitride crystal substrate, and
K and a are constants, satisfying $1.5 \times 10^{-19} \leq K \leq 6.0 \times 10^{-19}$, a=3).

(Supplementary Description 16)
There is provided a method for manufacturing a semiconductor laminate, including:
preparing a nitride crystal substrate comprising group-III nitride crystal and containing n-type impurities; and
irradiating the nitride crystal substrate with at least infrared rays, to heat the nitride crystal substrate,
wherein, in the preparation of the nitride crystal substrate, a substrate in which an absorption coefficient at a wavelength of 2 μm is 1.2 cm$^{-1}$ or more and a difference between a maximum value and a minimum value of the absorption coefficient at a wavelength of 2 μm in a main surface is within 1.0 cm$^{-1}$, is prepared as the nitride crystal substrate.

(Supplementary Description 17)
There is provided the method for manufacturing the semiconductor laminate according to the supplementary description 15 or 16,
wherein the heating of the nitride crystal substrate includes: epitaxially growing a semiconductor layer including group-III nitride semiconductor on the nitride crystal substrate.

(Supplementary Description 18)
There is provided the method for manufacturing the semiconductor laminate according to the supplementary description 17, including:
epitaxially growing a p-type semiconductor layer containing p-type impurities as a layer constituting the semiconductor layer, on the nitride crystal substrate,
wherein the heating of the nitride crystal substrate includes: heating the nitride crystal substrate, to activate the p-type impurities in the p-type semiconductor layer.

(Supplementary Description 19)
There is provided the method for manufacturing the semiconductor laminate according to the supplementary description 17, including:
ion-implanting predetermined impurities into the semiconductor layer,
wherein the heating of the nitride crystal substrate includes: heating the nitride crystal substrate, to activate the impurities in the semiconductor layer.

(Supplementary Description 20)
There is provided the method for manufacturing the semiconductor laminate according to any one of the supplementary descriptions 17 to 19, including:
forming an electrode to contact with at least one of a back surface of the nitride crystal substrate and a main surface of the semiconductor layer,
wherein the heating of the nitride crystal substrate includes: heating the nitride crystal substrate, to decrease a contact resistance of the electrode.

(Supplementary Description 21)
There is provided the method for manufacturing the semiconductor laminate according to any one of the supplementary descriptions 17 to 20, including:
forming a protective layer on the semiconductor layer,
wherein the heating of the nitride crystal substrate includes: heating the nitride crystal substrate, to cure the protective layer.

(Supplementary Description 22)
There is provided the method for manufacturing the semiconductor laminate according to any one of the supplementary descriptions 17 to 21,
wherein the preparation of the nitride crystal substrate includes: growing nitride crystal of group III element on a seed crystal substrate by loading the seed crystal substrate and a material containing the group III element into a reaction vessel, and by supplying halide of the material and a nitriding agent to the seed crystal substrate heated to a predetermined crystal growth temperature, and
in the growth of nitride crystal, a member at least whose surface comprises a quartz-free and boron-free material is used as a member constituting a high temperature region which is a region in the reaction vessel heated at least to the crystal growth temperature, and which is a gas contact region of a gas supplied to the seed crystal substrate.

(Supplementary Description 23)
There is provided the method for manufacturing the semiconductor laminate according to the supplementary description 22, wherein a member containing silicon carbide-coated graphite is used as the member constituting the high temperature region.

(Supplementary Description 24)
There is provided a method for manufacturing a semiconductor laminate, including:
preparing a nitride crystal substrate comprising group-III nitride crystal and containing n-type impurities; and
irradiating the nitride crystal substrate with at least infrared rays, to heat the nitride crystal substrate,
wherein the preparation of the nitride crystal substrate includes:
measuring an absorption coefficient of the nitride crystal substrate in an infrared region at 27° C.; and
determining whether the absorption coefficient α is approximately expressed by equation (1) in a wavelength range of at least 1 μm or more and 3.3 μm or less, based on the measured absorption coefficient of the nitride crystal substrate:

$$\alpha = nK\lambda^a \quad (1)$$

(wherein, λ(μm) is a wavelength,
α(cm$^{-1}$) is absorption coefficient of the nitride crystal substrate at 27° C.,
n (cm$^{-3}$) is a free electron concentration in the nitride crystal substrate, and
K and a are constants, satisfying $1.5 \times 10^{-19} \leq K \leq 6.0 \times 10^{-19}$, a=3).

(Supplementary Description 25)

There is provided a method for manufacturing a semiconductor laminate, including:

preparing a nitride crystal substrate comprising group-III nitride crystal and containing n-type impurities; and irradiating the nitride crystal substrate with at least infrared rays, to heat the nitride crystal substrate, wherein the preparation of the nitride crystal substrate includes:

measuring absorption coefficients in an infrared region at least at two or more points in a main surface of the nitride crystal substrate; and determining whether the absorption coefficient of the nitride crystal substrate at a wavelength of 2 μm is 1.2 cm$^{-1}$ or more and whether a difference between a maximum value and a minimum value of the absorption coefficient at a wavelength of 2 μm in the main surface of the nitride crystal substrate is within 1.0 cm$^{-1}$, based on the measured absorption coefficient of the nitride crystal substrate.

(Supplementary Description 26)

There is provided a method for manufacturing a semiconductor device, including:

preparing a nitride crystal substrate comprising group-III nitride crystal and containing n-type impurities; and irradiating the nitride crystal substrate with at least infrared rays, to heat the nitride crystal substrate, wherein, in the preparation of the nitride crystal substrate, a substrate with an absorption coefficient α being approximately expressed by equation (1) in a wavelength range of at least 1 μm or more and 3.3 μm or less, is prepared as the nitride crystal substrate:

$$\alpha = nK\lambda^{a} \quad (1)$$

(wherein, λ(μm) is a wavelength,

α(cm$^{-1}$) is absorption coefficient of the nitride crystal substrate at 27° C., n (cm$^{-3}$) is a free electron concentration in the nitride crystal substrate, and K and a are constants, satisfying $1.5 \times 10^{-19} \leq K \leq 6.0 \times 10^{-19}$, a=3).

(Supplementary Description 27)

There is provided a method for manufacturing a semiconductor device, including:

preparing a nitride crystal substrate comprising group-III nitride crystal and containing n-type impurities; and irradiating the nitride crystal substrate with at least infrared rays, to heat the nitride crystal substrate, wherein, in the preparation of the nitride crystal substrate, a substrate in which an absorption coefficient at a wavelength of 2 μm is 1.2 cm$^{-1}$ or more and a difference between a maximum value and a minimum value of the absorption coefficient at a wavelength of 2 μm in a main surface is within 1.0 cm$^{-1}$, is prepared as the nitride crystal substrate.

What is claimed is:

1. A nitride crystal substrate comprising group-III nitride crystal and containing n-type impurities, wherein an absorption coefficient α in a wavelength range of at least 1 μm or more and 3.3 μm or less satisfies equation (1)', $$1.5 \times 10^{-19} n\lambda^{3} \leq \alpha \leq 6.0 \times 10^{-19} n\lambda^{3} \quad (1)'$$

wherein, λ is a wavelength expressed in μm,

α is absorption coefficient of the nitride crystal substrate at 27° C. expressed in cm$^{-1}$, and n is a free electron concentration in the nitride crystal substrate expressed in cm$^{-3}$.

2. A nitride crystal substrate comprising group-III nitride crystal and containing n-type impurities, wherein an absorption coefficient α is approximately expressed by equation (1)" in a wavelength range of at least 1 μm or more and 3.3 μm or less according to the least-squares method, and an error of the measured absorption coefficient relative to the absorption coefficient α obtained from equation (1)" is within ±0.1α at the wavelength of 2 μm:

$$\alpha = 2.2 \times 10^{-19} n\lambda^{3} \quad (1)''$$

wherein, λ is a wavelength expressed in μm,

α is absorption coefficient of the nitride crystal substrate at 27° C. expressed in cm$^{-1}$, and n is a free electron concentration in the nitride crystal substrate expressed in cm$^{-3}$.

3. The nitride crystal substrate according to claim 1, wherein the absorption coefficient α and Δα satisfy equations (2) and (3) in a wavelength range of at least 1 μm or more and 3.3 μm or less:

$$\alpha \geq 0.15\lambda^{3} \quad (2)$$

$$\Delta\alpha \leq 1.0 \quad (3)$$

wherein, Δα is a difference between a maximum value and a minimum value of the absorption coefficient α in a main surface of the nitride crystal substrate.

4. A nitride crystal substrate comprising group-III nitride crystal and containing n-type impurities, wherein a concentration of boron in the nitride crystal substrate is less than $1 \times 10^{15}$ at·cm$^{-3}$, wherein an absorption coefficient of the nitride crystal substrate at a wavelength of 2 μm is 1.2 cm$^{-1}$ or more, and a difference between a maximum value and a minimum value of the absorption coefficient at a wavelength of 2 μm in a main surface of the nitride crystal substrate is within 1.0 cm$^{-1}$.

5. The nitride crystal substrate according to claim 1, wherein a concentration of intrinsic carriers thermally excited between bands of the nitride crystal substrate under a temperature condition of 27° C. or more and 1250° C. or less, is lower than a concentration of free electrons generated in the nitride crystal substrate by doping with the n-type impurities under a temperature condition of 27° C.

6. The nitride crystal substrate according to claim 1, wherein a concentration of free electrons generated in the nitride crystal substrate by doping with the n-type impurities, is $1 \times 10^{18}$ cm$^{-3}$ or more under a temperature condition of 27° C., and a difference between a maximum value and a minimum value of the free electron concentration in a main surface of the nitride crystal substrate is within $8.3 \times 10^{17}$ cm$^{-3}$.

7. The nitride crystal substrate according to claim 1, wherein a concentration of the n-type impurities in the nitride crystal substrate is $1 \times 10^{18}$ at·cm$^{-3}$ or more, and a difference between a maximum value and a minimum value of the concentration of the n-type impurities in a main surface of the nitride crystal substrate is within $8.3 \times 10^{17}$ at·cm$^{-3}$.

8. The nitride crystal substrate according to claim 1, wherein a concentration of oxygen in the nitride crystal substrate is 1/10 or less relative to a total concentration of silicon and germanium in the nitride crystal substrate.

9. A semiconductor laminate, comprising:

a nitride crystal substrate comprising group-III nitride crystal and containing n-type impurities; and a semiconductor layer comprising group-III nitride semiconductor and provided on the nitride crystal substrate,
wherein an absorption coefficient α
in a wavelength range of at least 1 µm or more and 3.3 µm or less satisfies equation (1)', $$1.5\times10^{-19}n\lambda^3 \le \alpha \le 6.0\times10^{-19}n\lambda^3 \quad (1)',$$

wherein, λ is a wavelength expressed in µm,
α is absorption coefficient of the nitride crystal substrate at 27° C. expressed in $cm^{-1}$, and
n is a free electron concentration in the nitride crystal substrate expressed in $cm^{-3}$.

10. A semiconductor laminate, comprising:
a nitride crystal substrate comprising group-III nitride crystal and containing n-type impurities; and
a semiconductor layer comprising group-III nitride semiconductor and provided on the nitride crystal substrate,
wherein a concentration of boron in the nitride crystal substrate is less than $1\times10^{15}$ at·$cm^{-3}$,
wherein an absorption coefficient of the nitride crystal substrate at a wavelength of 2 µm is 1.2 $cm^{-1}$ or more, and
a difference between a maximum value and a minimum value of the absorption coefficient at a wavelength of 2 µm in a main surface of the nitride crystal substrate is within 1.0 $cm^{-1}$.

11. The semiconductor laminate according to claim 9, wherein a reflectance of a surface of the semiconductor layer is 5% or more and 30% or less in a wavelength range of at least 1 µm or more and 3.3 µm or less.

12. A method for manufacturing a semiconductor laminate, comprising:
preparing a nitride crystal substrate comprising group-III nitride crystal and containing n-type impurities; and
irradiating the nitride crystal substrate with at least infrared rays, to heat the nitride crystal substrate,
wherein, in the preparation of the nitride crystal substrate, a substrate with an absorption coefficient α in a wavelength range of at least 1 µm or more and 3.3 µm or less satisfying equation (1)', is prepared as the nitride crystal substrate:

$$1.5\times10^{-19}n\lambda^3 \le \alpha \le 6.0\times10^{-19}n\lambda^3 \quad (1)',$$

wherein, λ is a wavelength expressed in µm,
α is absorption coefficient of the nitride crystal substrate at 27° C. expressed in $cm^{-1}$, and
n is a free electron concentration in the nitride crystal substrate expressed in $cm^{-3}$.

13. A method for manufacturing a semiconductor laminate, comprising:
preparing a nitride crystal substrate comprising group-III nitride crystal and containing n-type impurities; and
irradiating the nitride crystal substrate with at least infrared rays, to heat the nitride crystal substrate,
wherein, in the preparation of the nitride crystal substrate, a substrate in which an absorption coefficient at a wavelength of 2 µm is 1.2 $cm^{-1}$ or more and a difference between a maximum value and a minimum value of the absorption coefficient at a wavelength of 2 µm in a main surface is within 1.0 $cm^{-1}$, is prepared as the nitride crystal substrate.

14. The method for manufacturing the semiconductor laminate according to claim 12,
wherein the heating of the nitride crystal substrate comprises: epitaxially growing a semiconductor layer including group-III nitride semiconductor on the nitride crystal substrate.

15. The method for manufacturing the semiconductor laminate according to claim 14, comprising:
epitaxially growing a p-type semiconductor layer containing p-type impurities as a layer constituting the semiconductor layer, on the nitride crystal substrate,
wherein the heating of the nitride crystal substrate comprises: heating the nitride crystal substrate, to activate the p-type impurities in the p-type semiconductor layer.

16. The method for manufacturing the semiconductor laminate according to claim 14, comprising:
ion-implanting predetermined impurities into the semiconductor layer,
wherein the heating of the nitride crystal substrate comprises: heating the nitride crystal substrate, to activate the impurities in the semiconductor layer.

17. A method for manufacturing a semiconductor laminate, comprising:
preparing a nitride crystal substrate comprising group-III nitride crystal and containing n-type impurities; and
irradiating the nitride crystal substrate with at least infrared rays, to heat the nitride crystal substrate,
wherein the preparation of the nitride crystal substrate comprises:
measuring an absorption coefficient of the nitride crystal substrate in an infrared region at 27° C.; and
determining whether the absorption coefficient α in a wavelength range of at least 1 µm or more and 3.3 µm or less satisfies equation (1)' based on the measured absorption coefficient of the nitride crystal substrate:

$$1.5\times10^{-19}n\lambda^3 \le \alpha \le 6.0\times10^{-19}n\lambda^3 \quad (1)',$$

wherein, λ is a wavelength expressed in µm,
α is absorption coefficient of the nitride crystal substrate at 27° C. expressed in $cm^{-1}$, and
n is a free electron concentration in the nitride crystal substrate expressed in $cm^{-3}$.

18. A method for manufacturing a semiconductor laminate, comprising:
preparing a nitride crystal substrate comprising group-III nitride crystal and containing n-type impurities; and
irradiating the nitride crystal substrate with at least infrared rays, to heat the nitride crystal substrate,
wherein the preparation of the nitride crystal substrate comprises:
measuring absorption coefficients in an infrared region at least at two or more points in a main surface of the nitride crystal substrate; and
determining whether the absorption coefficient of the nitride crystal substrate at a wavelength of 2 µm is 1.2 $cm^{-1}$ or more and whether a difference between a maximum value and a minimum value of the absorption coefficient at a wavelength of 2 µm in the main surface of the nitride crystal substrate is within 1.0 $cm^{-1}$, based on the measured absorption coefficient of the nitride crystal substrate.

19. A method for manufacturing a semiconductor device, comprising:
preparing a nitride crystal substrate comprising group-III nitride crystal and containing n-type impurities; and
irradiating the nitride crystal substrate with at least infrared rays, to heat the nitride crystal substrate,
wherein, in the preparation of the nitride crystal substrate, a substrate with an absorption coefficient α in a wavelength range of at least 1 µm or more and 3.3 µm or less satisfying equation (1)', is prepared as the nitride crystal substrate:

$$1.5\times10^{-19}n\lambda^3 \le \alpha \le 6.0\times10^{-19}n\lambda^3 \quad (1)',$$

wherein, $\lambda$ is a wavelength expressed in μm, $\alpha$ is absorption coefficient of the nitride crystal substrate at 27° C. expressed in $cm^{-1}$, and n is a free electron concentration in the nitride crystal substrate expressed in $cm^{-3}$.

20. A method for manufacturing a semiconductor device, comprising:

preparing a nitride crystal substrate comprising group-III nitride crystal and containing n-type impurities; and irradiating the nitride crystal substrate with at least infrared rays, to heat the nitride crystal substrate, wherein, in the preparation of the nitride crystal substrate, a substrate in which an absorption coefficient at a wavelength of 2 μm is 1.2 $cm^{-1}$ or more and a difference between a maximum value and a minimum value of the absorption coefficient at a wavelength of 2 μm in a main surface is within 1.0 $cm^{-1}$, is prepared as the nitride crystal substrate.

21. The nitride crystal substrate according to claim 1, wherein a concentration of boron in the nitride crystal substrate is less than $1\times10^{15}$ at·$cm^{-3}$.

* * * * *